(12) United States Patent
Miura

(10) Patent No.: US 8,513,094 B2
(45) Date of Patent: Aug. 20, 2013

(54) METHOD OF MANUFACTURING SEMICONDUCTOR DEVICE

(75) Inventor: Tatsuhiko Miura, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/470,844

(22) Filed: May 14, 2012

(65) Prior Publication Data
US 2012/0309191 A1 Dec. 6, 2012

(30) Foreign Application Priority Data
Jun. 3, 2011 (JP) ................................. 2011-124801

(51) Int. Cl.
*H01L 21/46* (2006.01)
*H01L 21/30* (2006.01)

(52) U.S. Cl.
USPC .......................................... 438/459; 438/456

(58) Field of Classification Search
USPC ................................................. 438/456, 459
See application file for complete search history.

(56) References Cited

U.S. PATENT DOCUMENTS

| 5,326,725 A * | 7/1994 | Sherstinsky et al. | 438/778 |
| 5,352,294 A * | 10/1994 | White et al. | 118/725 |
| 6,033,480 A * | 3/2000 | Chen et al. | 118/715 |
| 7,579,044 B2 * | 8/2009 | Brand et al. | 427/284 |
| 2004/0063263 A1 * | 4/2004 | Suzuki et al. | 438/197 |

FOREIGN PATENT DOCUMENTS

| JP | 2006-005271 | 1/2006 |
| JP | 2007-266347 | 10/2007 |
| WO | WO 2005/124848 | 12/2005 |

\* cited by examiner

*Primary Examiner* — Luan C Thai
(74) *Attorney, Agent, or Firm* — Young & Thompson

(57) ABSTRACT

In the manufacturing steps of a power-type semiconductor device, after grinding the back surface of the semiconductor wafer, when a metal film is deposited by sputtering deposition over the back surface of the wafer in a preheated state, the wafer is contained in an annular susceptor, and processed. A radial vertical cross section of the annular shape of the susceptor has a first upper surface closer to a horizontal surface for holding a peripheral portion of the top surface of the semiconductor wafer against gravity, and a second upper surface continued to and located outside the first upper surface and closer to a vertical surface for holding a side surface of the semiconductor wafer against lateral displacement.

12 Claims, 33 Drawing Sheets

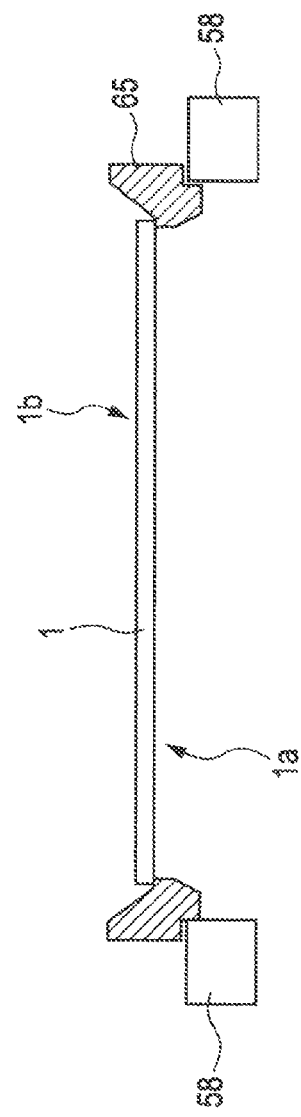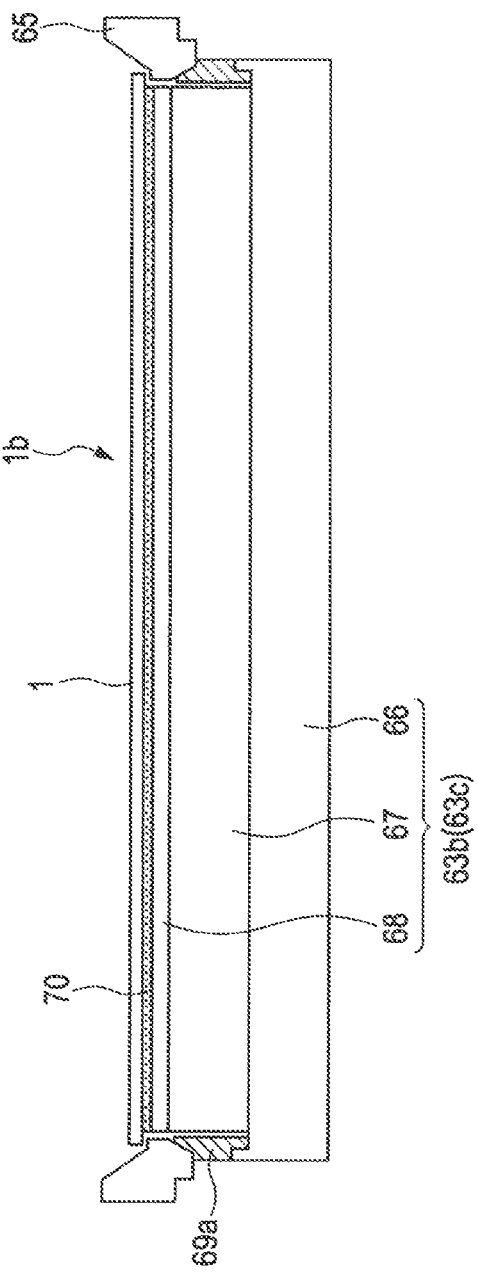

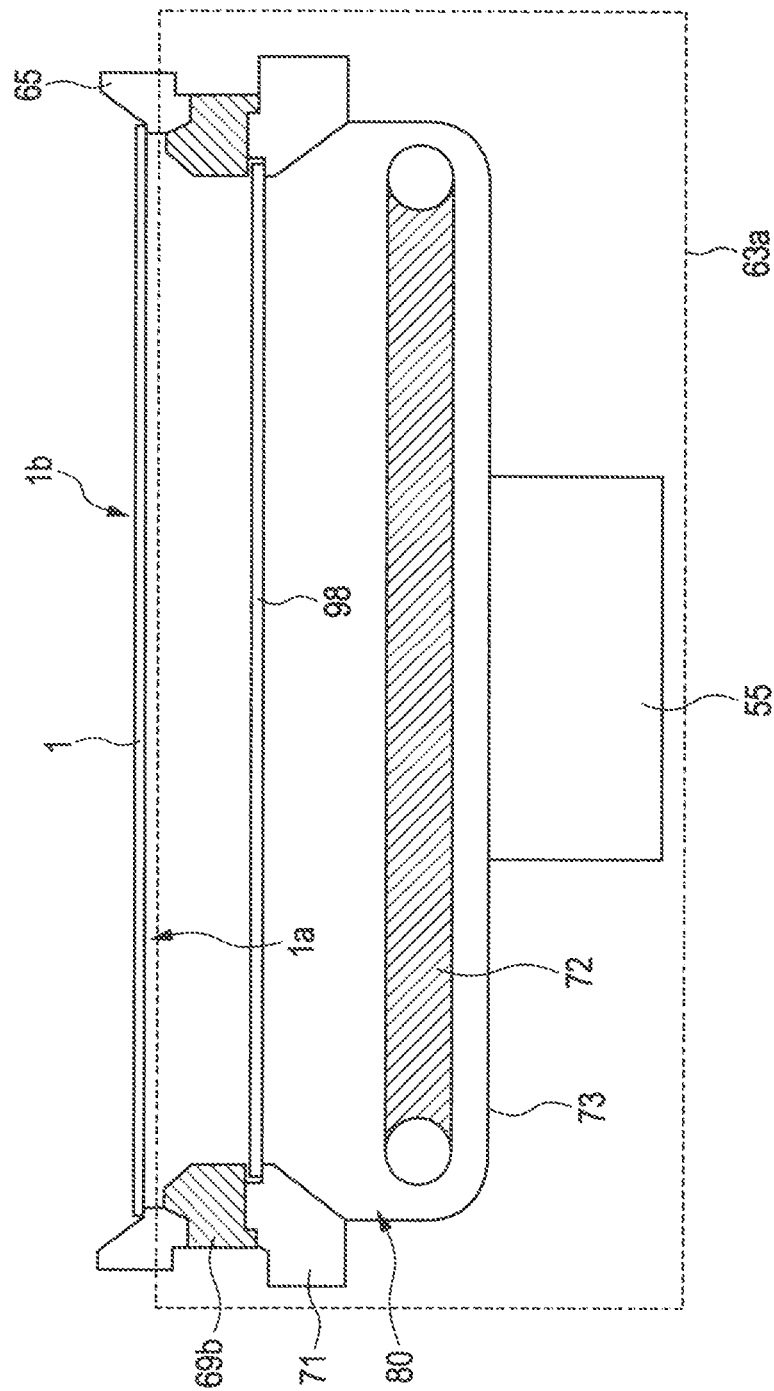

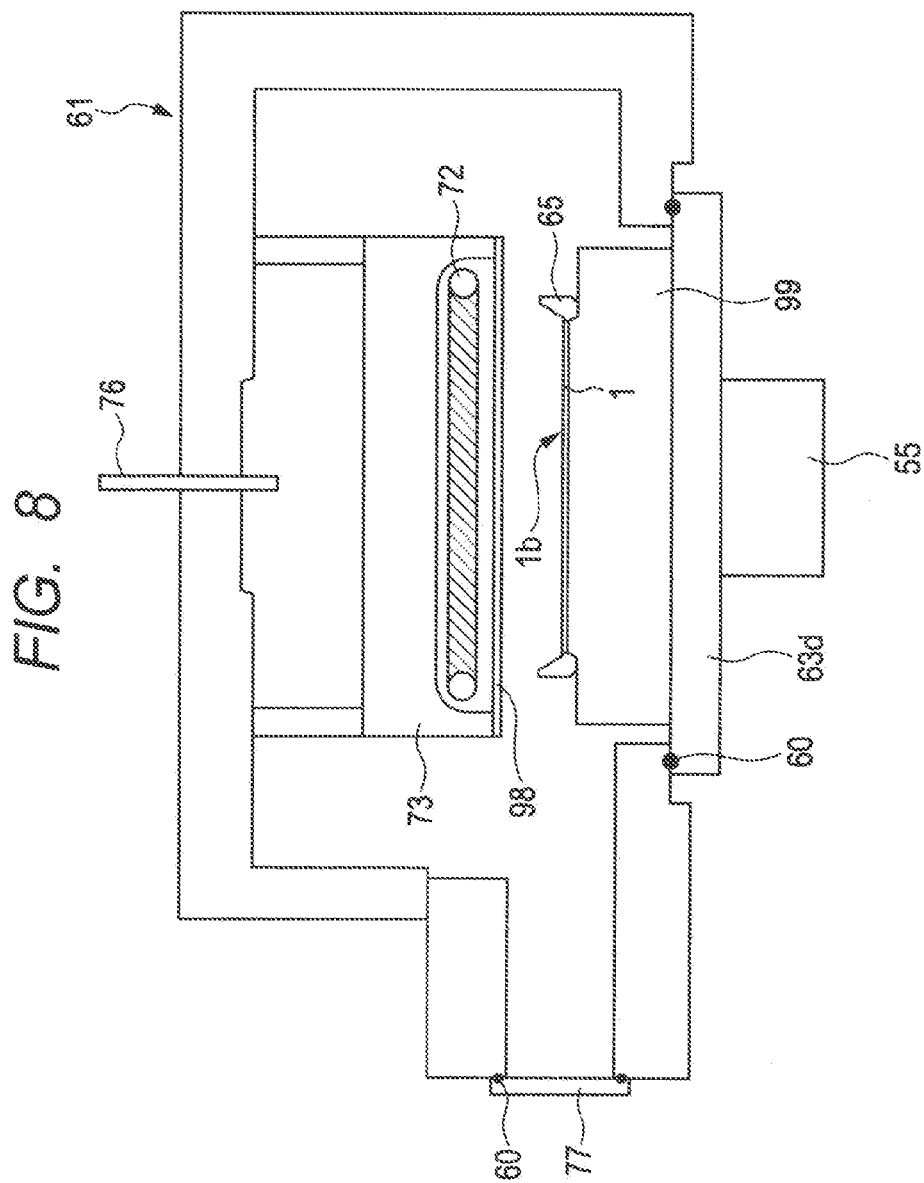

METHOD OF MANUFACTURING SEMICONDUCTOR DEVICE

CROSS-REFERENCE TO RELATED APPLICATIONS

The disclosure of Japanese Patent Application No. 2011-124801 filed on Jun. 3, 2011 including the specification, drawings and abstract is incorporated herein by reference in its entirety.

BACKGROUND

The present invention relates to a technology which is effective when applied to a sputtering deposition technique for a method of manufacturing a semiconductor device (or semiconductor integrated circuit device).

In Japanese Unexamined Patent Publication No. 2007-266347 (Patent Document 1), a process and a device are disclosed in which, after the completion of a process of forming a device element such as a diode over a top surface of a wafer, grinding or the like is performed on the back surface of the wafer to thin the wafer, and then sputtering deposition and a heating process are performed on the back surface of the wafer. A wafer holder used therefor includes a ring-shaped quartz lower holder for supporting the surface of the wafer from below, and a plurality of wafer pressing claws for pressing the periphery of the wafer from above. Over the wafer, a sputtering target is disposed and, under a circular opening in the quartz lower holder, a lamp for a heating process is disposed.

In Japanese Unexamined Patent Publication No. 2006-5271 (Patent Document 2) and International Publication WO 2005/124848 Pamphlet (Patent Document 3) corresponding thereto, an annular SiC susceptor used for a heating process on a wafer or the like is disclosed. The portion of the susceptor for supporting the wafer has an upwardly protruding curved cross-sectional shape.

RELATED ART DOCUMENTS

Patent Documents

[Patent Document 1]
Japanese Unexamined Patent Publication No. 2007-266347
[Patent Document 2]
Japanese Unexamined Patent Publication No. 2006-5271
[Patent Document 3]
International Publication WO 2005/124848 Pamphlet

SUMMARY

In the manufacturing steps of a power-type semiconductor device such as a power MOSFET or an IGBT, when a metal electrode is formed over the back surface of a semiconductor wafer by sputtering deposition or the like, a process is performed in which the wafer is contained in an annular susceptor without attaching a reinforcing member such as a glass reinforcing plate to the wafer, and subjected to a sequence of processes such as a preheating process and a deposition process, while being held stably by its own weight.

However, the study conducted by the present inventors on such a sequence of processes has revealed that the thinned wafer is likely to be warped by a heating process or the like, and the warped wafer has a high possibility of vibrating to be displaced in the susceptor and undergo a transportation failure or a wafer crack.

The present invention has been achieved to solve such problems.

An object of the present invention is to provide a highly reliable manufacturing process of a semiconductor device.

The above and other objects and novel features of the present invention will become apparent from a statement in the present specification and the accompanying drawings.

The following is a brief description of the outline of a representative aspect of the invention disclosed in the present application.

That is, according to the aspect of the present invention, after the grinding of the back surface of a semiconductor wafer, when a metal film is deposited by sputtering deposition over the wafer in a preheated state, the wafer is contained in an unrestrained state in an annular susceptor to be processed. A radial vertical cross section of the annular shape of the susceptor has a first upper surface for holding a peripheral portion of the top surface of the semiconductor wafer against gravity, and a second upper surface continued to and located outside the first upper surface and having an inclination closer to that of a vertical surface than the inclination of the first upper surface to hold a side surface of the semiconductor wafer against lateral displacement. The angle formed by the second upper surface and the vertical surface is set to a value of not less than 0 degrees and not more than 20 degrees.

The following is a brief description of effects achievable by the representative aspect of the invention disclosed in the present application.

That is, after the grinding of the back surface of a semiconductor wafer, when a metal film is deposited by sputtering deposition over the wafer in a preheated state, the wafer is contained in an unrestrained state in an annular susceptor to be processed. A radial vertical cross section of the annular shape of the susceptor has a first upper surface for holding a peripheral portion of the top surface of the semiconductor wafer against gravity, and a second upper surface continued to and located outside the first upper surface and having an inclination closer to that of a vertical surface than the inclination of the first upper surface to hold a side surface of the semiconductor wafer against lateral displacement. The angle formed by the second upper surface and the vertical surface is set to a value of not less than 0 degrees and not more than 20 degrees. This can effectively prevent the displacement of the wafer during the processing thereof.

BRIEF DESCRIPTION OF THE DRAWINGS

FIG. 5 is a cross-sectional view of the wafer susceptor corresponding to the X-X' cross section of FIG. 4 (when held by the internal transportation robot);

FIG. 6 is a front cross-sectional structural view of cooling wafer stages 63b and 63c in the wafer-back-side multilayer metal deposition apparatus shown in FIGS. 1 and 2;

FIG. 7 is a front cross-sectional structural view of a lamp-heating wafer stage 63a in the wafer-back-side multilayer metal deposition apparatus shown in FIGS. 1 and 2;

FIG. 8 is a front cross-sectional structural view (during a degassing process) of a load lock chamber 61 in the wafer-back-side multilayer metal deposition apparatus shown in FIGS. 1 and 2;

FIG. 27 is a plan view of a wafer and the wafer susceptor on the periphery thereof for illustrating the relationships between the wafer and the individual parts of the wafer susceptor over the lamp-heating wafer stage 63a;

DETAILED DESCRIPTION

[Outline of Embodiments]

Figure 1:
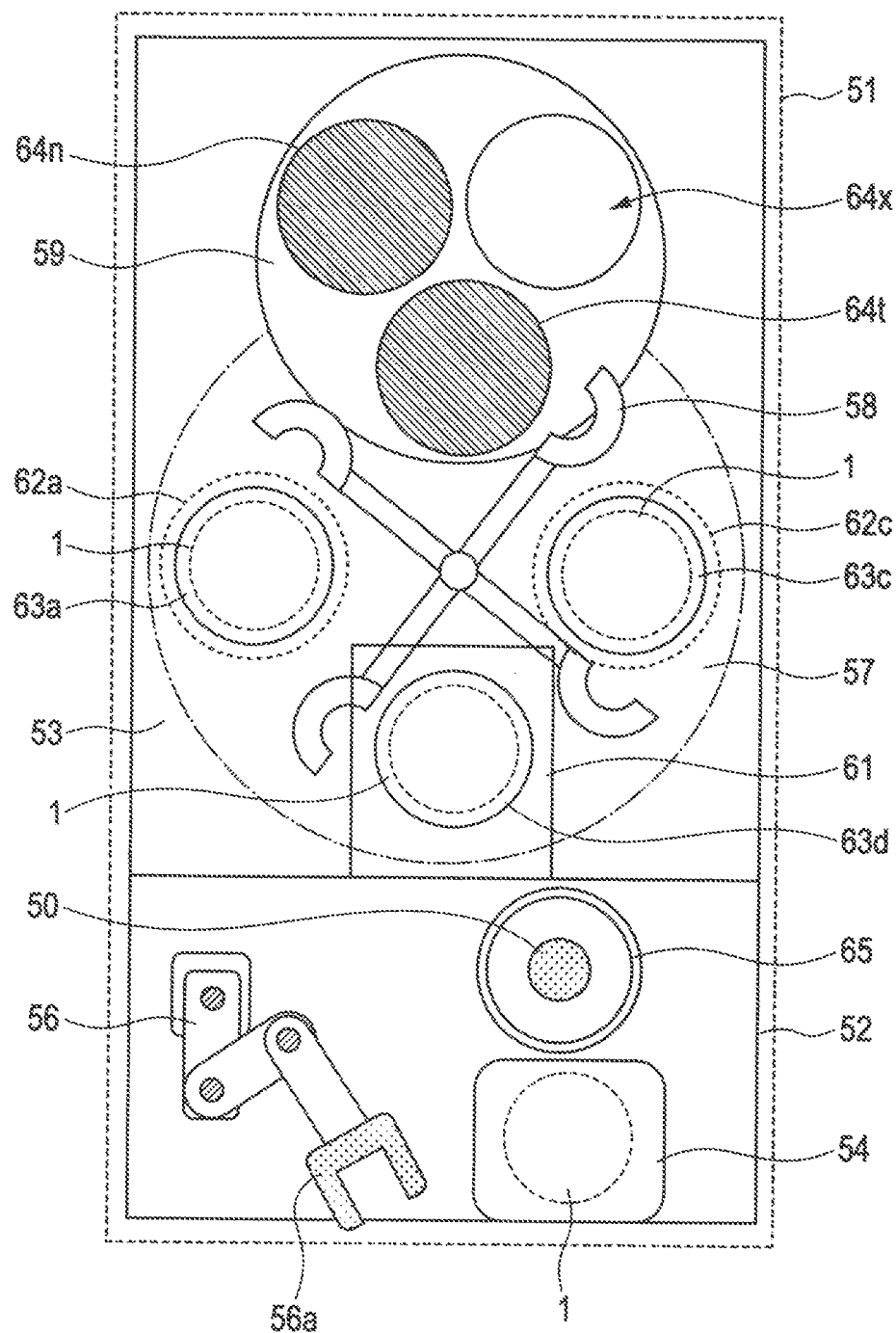
FIG. 1 is a top view of a wafer-back-side multilayer metal deposition apparatus used for a method of manufacturing a semiconductor device of an embodiment of the present invention.

First, a description will be given to the outline of a representative embodiment of the invention disclosed in the present application.

1. A method of manufacturing a semiconductor device includes the steps of: (a) performing a grinding process on a back surface of a semiconductor wafer having a top surface thereof for which a device element formation process has been completed to thin the semiconductor wafer; (b) after the step (a), performing a preheating process on the semiconductor wafer in a state where the semiconductor wafer is held on a susceptor by its own weight with the top surface thereof facing downward to heat the semiconductor wafer to a temperature higher than a room temperature; and (c) after the step (b), depositing a first metal film by sputtering deposition over the back surface of the semiconductor wafer in a state where the semiconductor wafer is held on the susceptor by its own weight with the top surface thereof facing downward, while maintaining the heated state, wherein the susceptor exhibits an annular shape, and a radial vertical cross section of the annular shape has the following upper surfaces, which are: (x1) the first upper surface for holding a peripheral portion of the top surface of the semiconductor wafer against gravity; and (x2) the second upper surface continued to and located outside the first upper surface, and having an inclination closer to that of a vertical surface than an inclination of the first upper surface to hold a side surface of the semiconductor wafer against lateral displacement, and wherein a first angle formed by the second upper surface and the vertical surface is not less than 0 degrees and not more than 20 degrees.

2. In the method of manufacturing a semiconductor device according to article 1, the first angle is not less than 5 degrees and not more than 15 degrees.

3. In the method of manufacturing a semiconductor device according to article 1 or 2, the susceptor is made of quartz.

4. In the method of manufacturing a semiconductor device according to any one of articles 1 to 3, the semiconductor device is a power-type semiconductor device.

5. In the method of manufacturing a semiconductor device according to any one of articles 1 to 4, the semiconductor wafer is a silicon-based wafer.

6. The method of manufacturing a semiconductor device according to article 5 further includes the step of: (d) after the step (c), performing a heating process in a state where the semiconductor wafer is held on the susceptor by its own weight with the top surface thereof facing downward to silicidize the first metal film.

7. The method of manufacturing a semiconductor device according to article 6 further includes the steps of: (e) after the step (d), causing a suction attracting stage to attract the top surface of the semiconductor wafer by suction in a state where the semiconductor wafer is contained in the susceptor; and (f) after the step (e), depositing a second metal film by sputtering deposition over the back surface of the semiconductor wafer in a state where the semiconductor wafer is contained in the susceptor with the top surface of the semiconductor wafer being attracted by suction by the suction attracting stage.

8. In the method of manufacturing a semiconductor device according to any one of articles 1 to 7, a thickness of the semiconductor wafer after the step (a) is not more than 280 micrometers.

9. In the method of manufacturing a semiconductor device according to article 7 or 8, in the steps (b) to (f), the semiconductor wafer is not bonded to a reinforcing plate.

10. In the method of manufacturing a semiconductor device according to any one of articles 1 to 9, the radial vertical cross section of the annular shape of the susceptor has the following upper surface, which is: (x3) the third upper surface continued to and located outside the second upper surface, and having an inclination closer to that of a horizontal surface than the inclination of the second upper surface.

11. In the method of manufacturing a semiconductor device according to any one of articles 1 to 8 and 10, in the steps (b) to (c), the semiconductor wafer is not bonded to a reinforcing plate.

12. In the method of manufacturing a semiconductor device according to any one of articles 1 to 11, the temperature to which the semiconductor wafer is heated by the preheating process is not less than 250 degrees Celsius.

[Explanation of Description Form, Basic Terminology, and Use thereof in Present Application]

1. In the present application, if necessary for the sake of convenience, the description of an embodiment may be such that the embodiment is divided into a plurality of sections in the description thereof. However, they are by no means independent of or distinct from each other unless particularly explicitly described otherwise, and one of the individual sections of a single example is details, variations, and so forth of part or the whole of the others. In principle, a repeated description of like parts will be omitted. Each constituent element in the embodiment is not indispensable unless particularly explicitly described otherwise, unless the constituent element is theoretically limited to a given number, or unless it is obvious from the context that the constituent element is indispensable.

Also in the present application, when "semiconductor devices" are mentioned, they primarily refer to stand-alone devices such as various transistors (active elements) and to a structure in which a resistor, a capacitor, and the like are integrated around such a stand-alone device over a semiconductor chip or the like (e.g., a single-crystal silicon substrate). Note that the stand-alone device mentioned above actually has a plurality of minute elements integrated therein. Representative examples of the various transistors that can be shown include MISFETs (Metal Insulator Semiconductor Field Effect Transistors) represented by a MOSFET (Metal Oxide Semiconductor Field Effect Transistor) and IGBTs (Insulated gate Bipolar Transistors). Even when "MOS" is mentioned, an insulating film is not limited to an oxide.

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise or unless it is obvious from the context that it excludes such a material, a composition, or the like. For example, when a component is mentioned, the wording means "X containing A as a main component" or the like. It will be appreciated that, even when, e.g., a "silicon member" or the like is mentioned, it is not limited to pure silicon, and a member containing a SiGe alloy, another multi-element alloy containing silicon as a main component, another additive, or the like is also included. Likewise, it will also be appreciated that, even when a "silicon oxide film", "silicon-oxide-based insulating film", or the like is mentioned, it includes not only a relatively pure Undoped Silicon Dioxide, but also a thermal oxide film of FSG (Fluorosilicate Glass), TEOS-based silicon oxide, SiOC (Silicon Oxycarbide), Carbon-doped Silicon oxide, OSG (Organosilicate glass), PSG (Phosphorus Silicate Glass), BPSG (Borophosphosilicate Glass), or the like, a CVD oxide film, a coated silicon oxide such as SOG (Spin ON Glass) or NCS (Nano-Clustering Silica), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials belonging to this system include SiN, SiCN, SiNH, SiCNH, and the like. Here, when "silicon nitride" is mentioned, it includes both of SiN and SiNH unless particularly explicitly described otherwise. Likewise, when "SiCN" is mentioned, it includes both of SiCN and SiCNH unless particularly explicitly described otherwise.

Note that SiC has properties similar to those of SiN while, in most cases, SiON should rather be categorized into a silicon-oxide-based insulating film.

3. Likewise, it will also be appreciated that, although a preferred example is shown in association with a graphical figure, a position, an attribute, or the like, the graphical figure, position, attribute, or the like is not strictly limited thereto unless particularly explicitly described otherwise or unless it is obvious from the context that the graphical figure, position, attribute, or the like is strictly limited thereto.

4. Further, when a specific numerical value or numerical amount is mentioned, it may be a value more or less than the specific numerical value unless particularly explicitly described otherwise, unless the numerical value is theoretically limited to a given number, or unless it is obvious from the context that the numeral value is limited to a given number.

5. When a "wafer" is mentioned, it typically refers to a single-crystal silicon wafer over which a semiconductor device (the same as a semiconductor integrated circuit device or an electronic device) is formed, but it will be appreciated that the "wafer" also includes a composite wafer of an insulating substrate and a semiconductor layer or the like, such as an epitaxial wafer, a SOI substrate, or an LCD glass substrate.

6. In the present invention, "continuously performing" processing on a wafer means that the processing is continuously or intermittently performed so as to maximize the use rate of each of deposition areas in a load lock chamber and a sputtering deposition chamber in such a manner that, for example, if wafers are assumed to be processed in batches each including twenty-five wafers, simultaneously with or subsequently to the movement of the first wafer from the load lock chamber to the sputtering deposition chamber, the second wafer is introduced into the load lock chamber and, simultaneously with or subsequently to the movement of the second wafer from the load lock chamber to the sputtering deposition chamber, the third wafer is introduced into the load lock chamber. Note that, as necessary, intermissions between processes, a standby time, and the like may also be provided for various reasons.

7. In the present invention, when the wording "spatially independent" is used with regard to a processing chamber, the load lock chamber, or the like, it means that such a processing chamber, load lock chamber, or the like is independent when changed into a vacuum chamber, and geometrically means that there is no space/passage (referred to as "macroscopic space/passage") having a macroscopic cross section between the chamber (space region 1) and the other region (space region 2). Also, the wording "spatially integral" means that, when changed into a vacuum chamber, such a processing chamber, load lock chamber, and the like form a substantially coupled integral vacuum chamber, and an overall atmospheric pressure is substantially uniform in a steady state, and geometrically means that any two points in a space region of concern can be coupled by a macroscopic space/passage passing only through the inside thereof. However, in such cases, the absence of an element which produces a significant pressure difference between the both ends thereof, such as a vacuum pump, at a middle point in the macroscopic space/passage is conditioned.

8. In the present invention, a "power-type semiconductor device" indicates, e.g., a power MOSFET, an IGBT, an LDMOSFET (Laterally Diffused MOSFET), or the like, or an integrated circuit having at least one of them. The same holds true for a "power MOS-type semiconductor device", "IGBT-type semiconductor device", "LDMOS-type semiconductor device", or the like.

9. In the present invention, a "state where a wafer is contained in a susceptor" indicates a state where the wafer is held on the susceptor in contact relation therewith or a state where the wafer is not in contact with the susceptor, but is in the susceptor. That is, the "state where a wafer is contained in a susceptor" means that the main portion of the wafer is between the wafer placement portion of the susceptor and the upper end portion thereof. In other words, the "state where a wafer is contained in a susceptor" indicates the "state of the wafer being contained in the susceptor". Note that a state where the wafer is contained in the susceptor in contact relation therewith is particularly referred to as the "state of the wafer being placed on the susceptor".

Also, a state where "a wafer is held on a susceptor by its own weight" indicates a state where the wafer is contained in the susceptor, is held on the susceptor in contact relation therewith, and is not forcibly fixed by a mechanical fixing means applied to the wafer from thereabove such as wafer pressing claws or a wafer pressing jig or a suction attracting means applied to the wafer from therebelow such as a vacuum chuck or an electrostatic chuck. That is, the wafer is in a "freely placed state".

Also, a state where a wafer is restrained by a mechanical fixing means or a suction attracting means irrespective of whether the wafer is placed on the susceptor or merely contained in the susceptor is referred to as a "restrained state". Here, restraint by the mechanical fixing means is referred to as "mechanical restraint", and restraint by the suction attracting means is referred to as "suction attraction restraint".

Therefore, the "freely placed state" can be referred to as the "state of the wafer being unrestrainedly placed on the susceptor".

10. In the present invention, when an "annular radial vertical cross section" is mentioned with regard to an annular or ring-shaped wafer susceptor (or simply a susceptor), it indicates the X-O cross section of FIG. 4. That is, the "annular radial vertical cross section" indicates a cross section obtained by cutting an annular shape along a half-plane including a line radially extending from the center of the annular shape. However, it will be appreciated that, even when an annular shape or a ring shape is mentioned, completeness is not required thereof.

11. In the present invention, when a "thinned wafer" or a "thin-film wafer" is mentioned, the thickness of the wafer is not more than 280 micrometers. Also, when a "reinforcing plate" is mentioned with regard to the thin-film wafer, it is a plate-like member having the same area and shape as those of the wafer, and thicker than the wafer at the time when it is thinned.

[Details of Embodiments]

The embodiments will be described in greater detail. In the drawings, the same or like parts are designated by the same or similar marks or reference numerals, and a description thereof will not be repeated in principle.

In the accompanying drawings, hatching or the like may be omitted even in a cross section when hatching or the like results in complicated illustration or when the distinction between a portion to be hatched and a vacant space is distinct. In relation thereto, even a two-dimensionally closed hole may have a background outline thereof omitted when it is obvious from the description or the like that the hole is two-dimensionally closed, and so forth. On the other hand, even though not shown in a cross section, a portion other than a vacant space may be hatched to clearly show that the hatched portion is not a vacant space.

Note that examples of a related art patent application disclosed with regard to a metal deposition technique for the back surface of a wafer include Japanese Patent Application No. 2009-299072 (Japan Filing Date: Dec. 29, 2009).

1. Description of Example of Power MOSFET Manufactured by Method of Manufacturing Semiconductor Device of Above Embodiment of Present Invention (See Mainly FIG. 14)

A specific description will be given herein using a power MOSFET (examples of an application thereof include, e.g., the high-side switch of a DC-DC converter for PC power source) as an example of a power-type semiconductor device, but the present invention is not limited thereto. It will be appreciated that the present invention is also applicable to an IGBT or the like.

A specific example will be given herein using, as an example, a device having a chip size of about 2 millimeter long and about 3 millimeter wide, but the present invention is not limited thereto. It will be appreciated that the present invention is applicable to devices having chip shapes of various sizes, such as a square shape and a rectangular shape.

Figure 14:
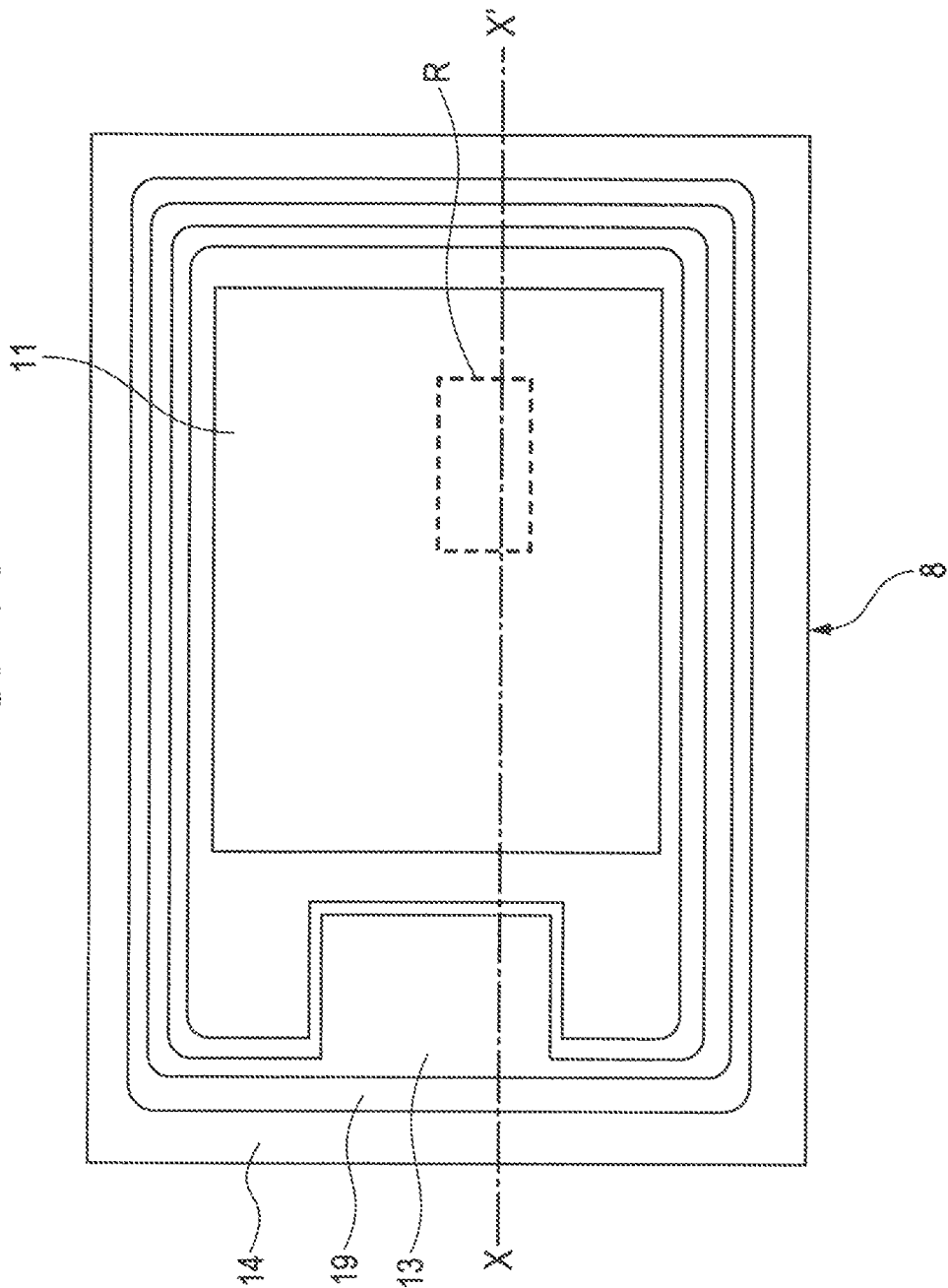
FIG. 14 is a device top view showing an example of a power MOSFET manufactured by the method of manufacturing the semiconductor device of the embodiment of the present invention.

FIG. 14 is a device top view showing an example of a power MOSFET manufactured by a method of manufacturing the semiconductor device of the embodiment of the present invention. Based on the drawing, a description will be given to an example of the power MOSFET manufactured by the method of manufacturing the semiconductor device of the embodiment of the present invention.

As shown in FIG. 14, in a power MOSFET element chip 8 (trench-gate power MOS semiconductor device) in which an element is formed over a square or rectangular plate-like silicon-based semiconductor substrate (which is a wafer before divided into individual chips), a source pad region 11 (an aluminum-based pad) located in a middle portion thereof occupies a major area. Under the source pad region 11, there is a belt-like repetitive device pattern region R (linear cell region) where a large number of belt-like gate electrodes (corresponding to columnar trench gate electrodes) extending sufficiently longer than the widths thereof (or than the pitch thereof) and a large number of belt-like source contact regions are alternately formed. More precisely, the linear cell region R expands throughout substantially the entire area under the source pad region 11, and the portion enclosed by the broken line is only a part thereof. Around the linear cell region R, there is a gate pad region 13 where the gate electrodes are extracted from the periphery thereof to the outside. Further around the gate pad region 13, an aluminum guard ring 19 is provided. The outermost peripheral portion of the chip 8 is a region where the wafer is divided by dicing or the like, i.e., a scribe region 14.

2. Description of Outline of Related Device Cross-Section Process Flow in Method of Manufacturing Semiconductor Device of Above Embodiment of Present Invention (See Mainly FIGS. 15 to 24)

In this section, in relation to an example of a liner-trench-gate power MOSFET in a 0.15 micrometer process, a process flow will be described with regard to the cut-out portion (linear cell region) R of the belt-like repetitive device pattern region of FIG. 14 in the first section based on FIGS. 15 to 24.

A specific description will be given below using the trench-gate power MOSFET as an example of the power MOSFET, but the present invention is not limited thereto. It will be appreciated that the present invention is also applicable to, e.g., a planar Vertical-MOSFET, an LD-MOSFET (examples of an application thereof include, e.g., a high-power amplifier such as an antenna module in a mobile telephone and the like), or the like.

Figure 15:
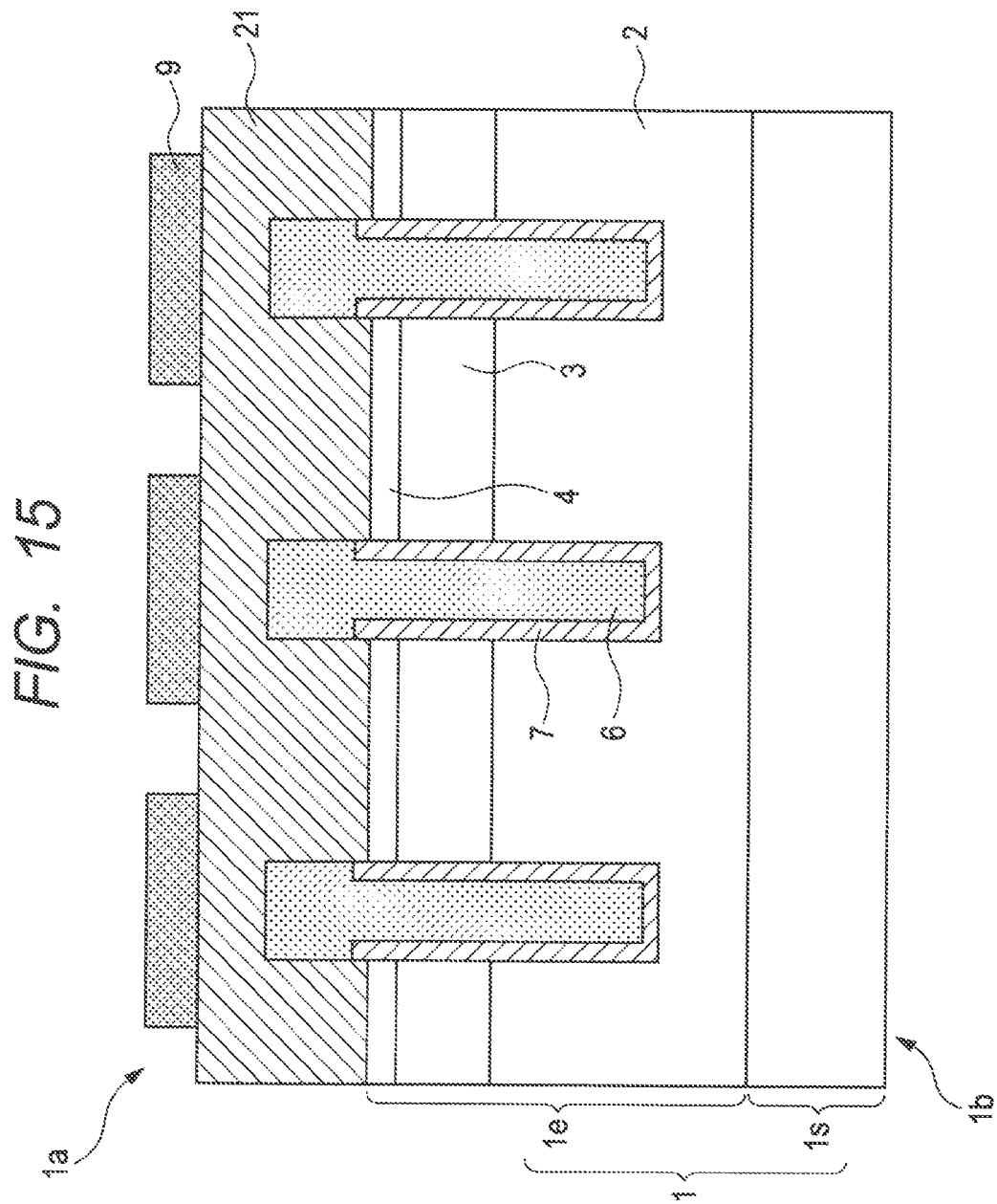
FIG. 15 is a device cross-sectional flow diagram (the step of forming a resist pattern for forming source/contact trenches) of a trench gate cell portion in the method of manufacturing the semiconductor device of the embodiment of the present invention.
Figure 16:
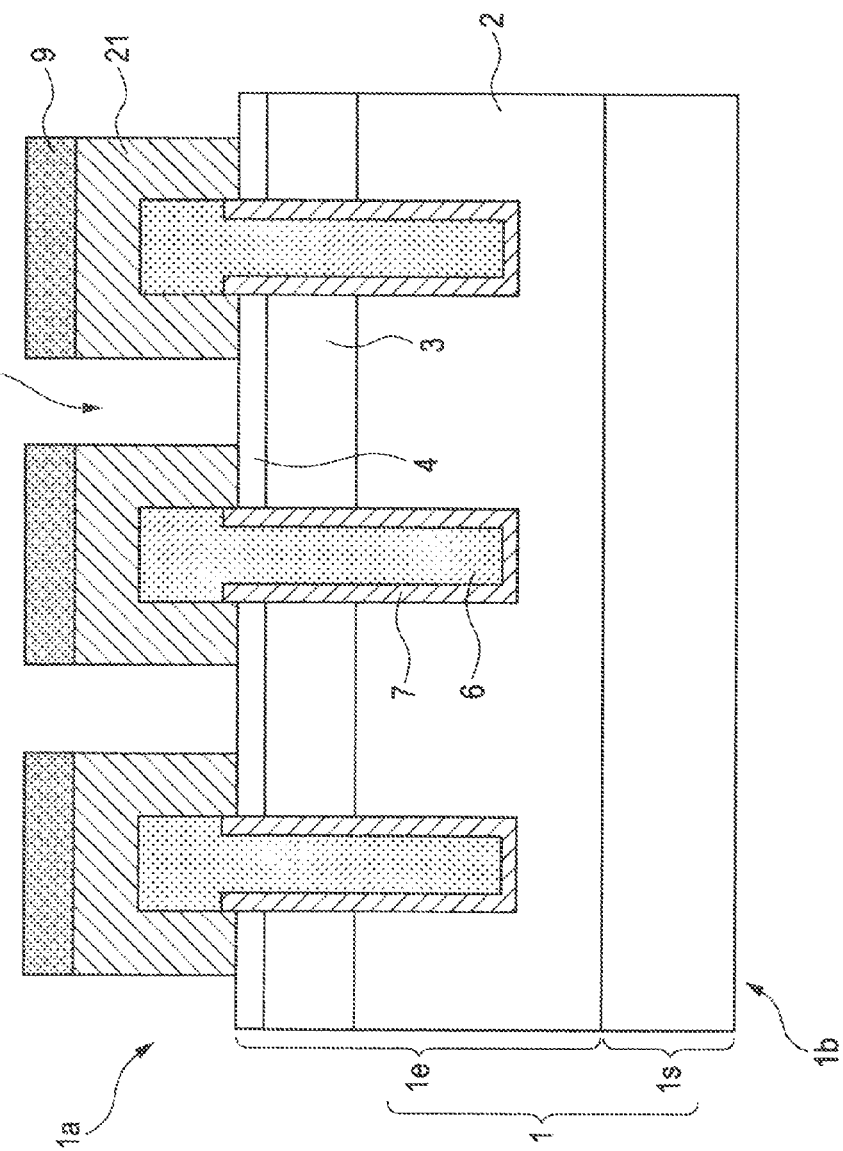
FIG. 16 is a device cross-sectional flow diagram (the step of forming the source/contact trenches) of the trench gate cell portion in the method of manufacturing the semiconductor device of the embodiment of the present invention.
Figure 17:
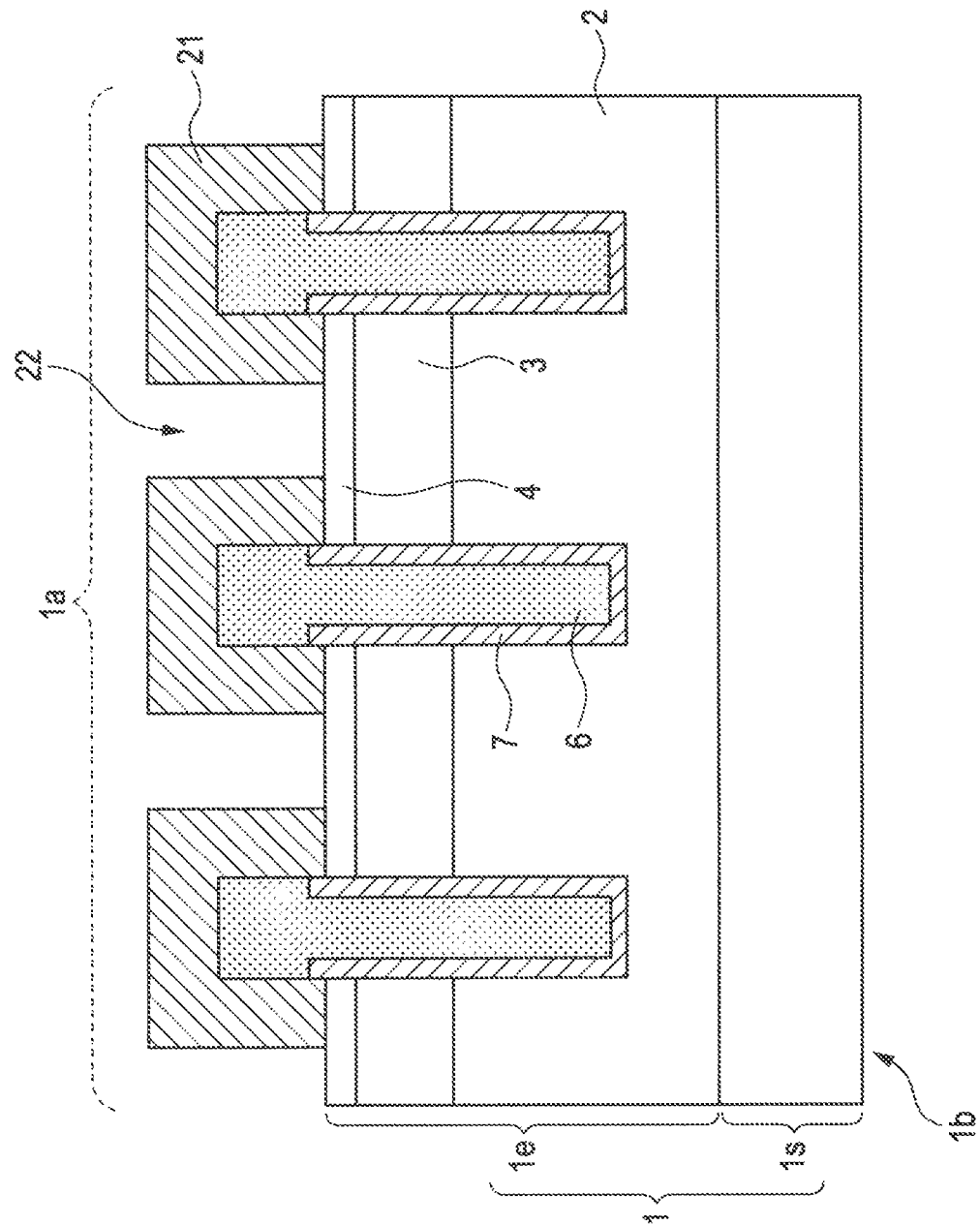
FIG. 17 is a device cross-sectional flow diagram (the step of removing the resist pattern for forming the source/contact trenches) of the trench gate cell portion in the method of manufacturing the semiconductor device of the embodiment of the present invention.
Figure 18:
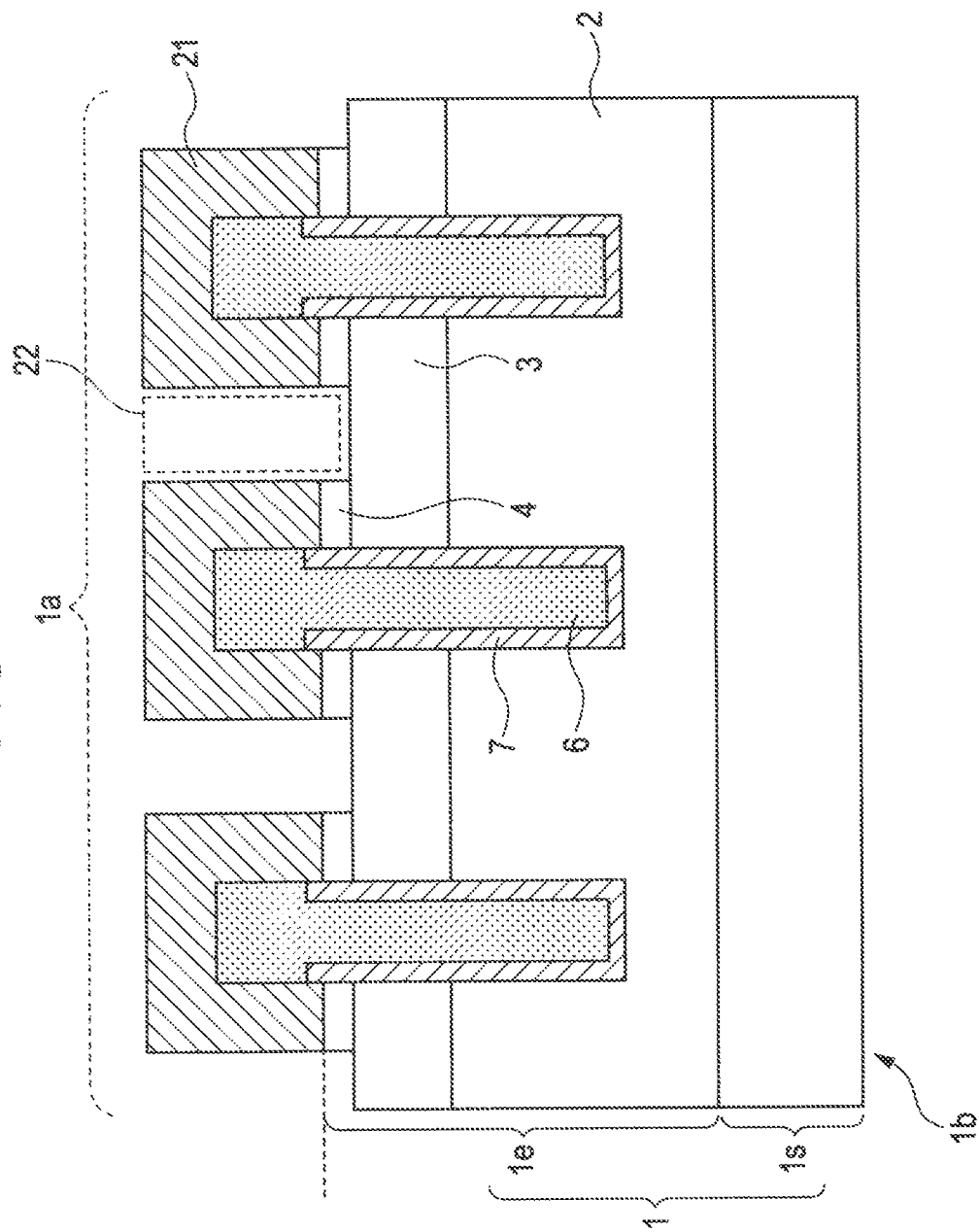
FIG. 18 is a device cross-sectional flow diagram (the step of extending the source/contact trenches) of the trench gate cell portion in the method of manufacturing the semiconductor device of the embodiment of the present invention.
Figure 19:
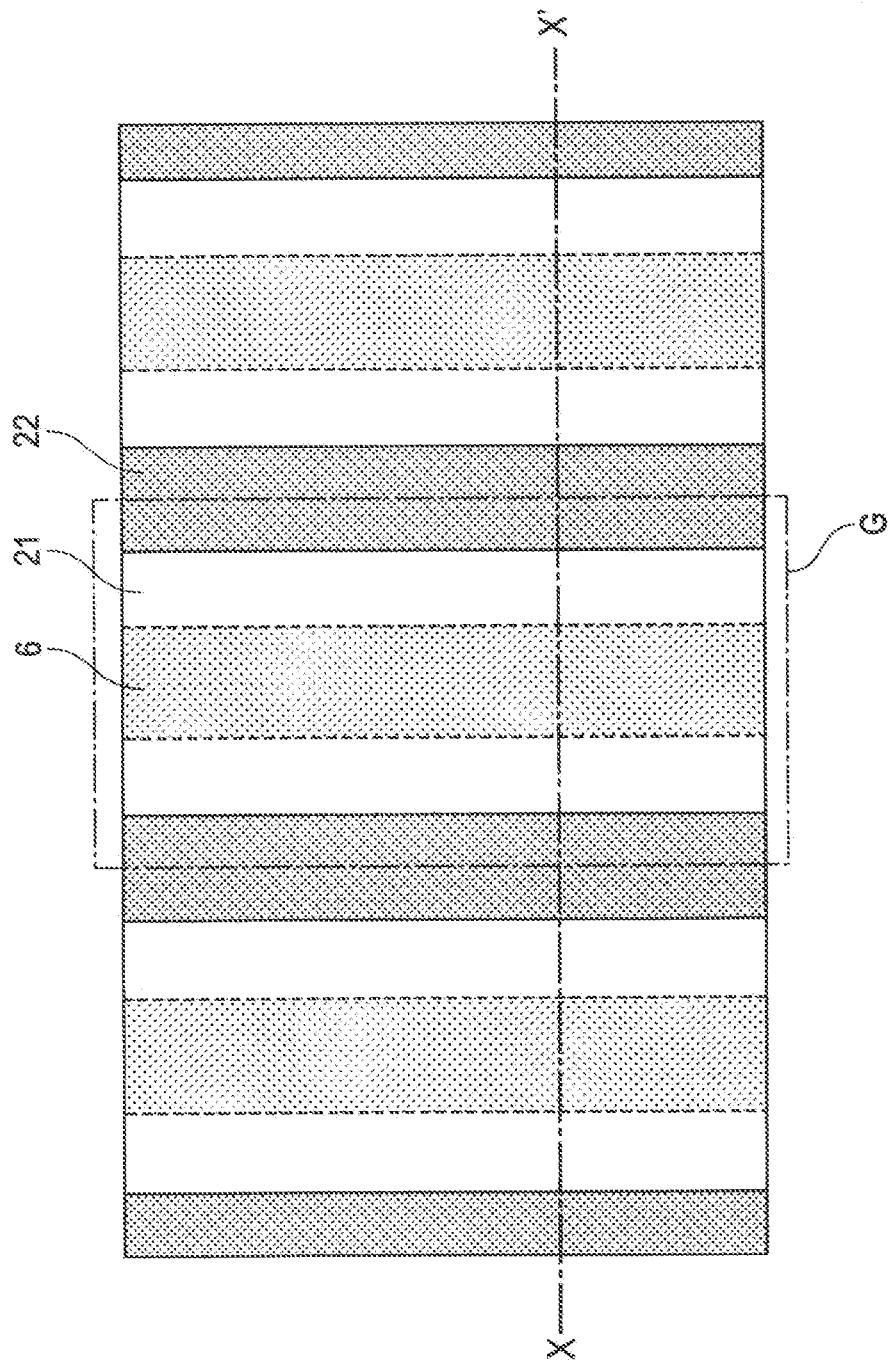
FIG. 19 is a device top view (the step of introducing p+body contact regions) of the trench gate cell portion in the method of manufacturing the semiconductor device of the embodiment of the present invention.
Figure 20:
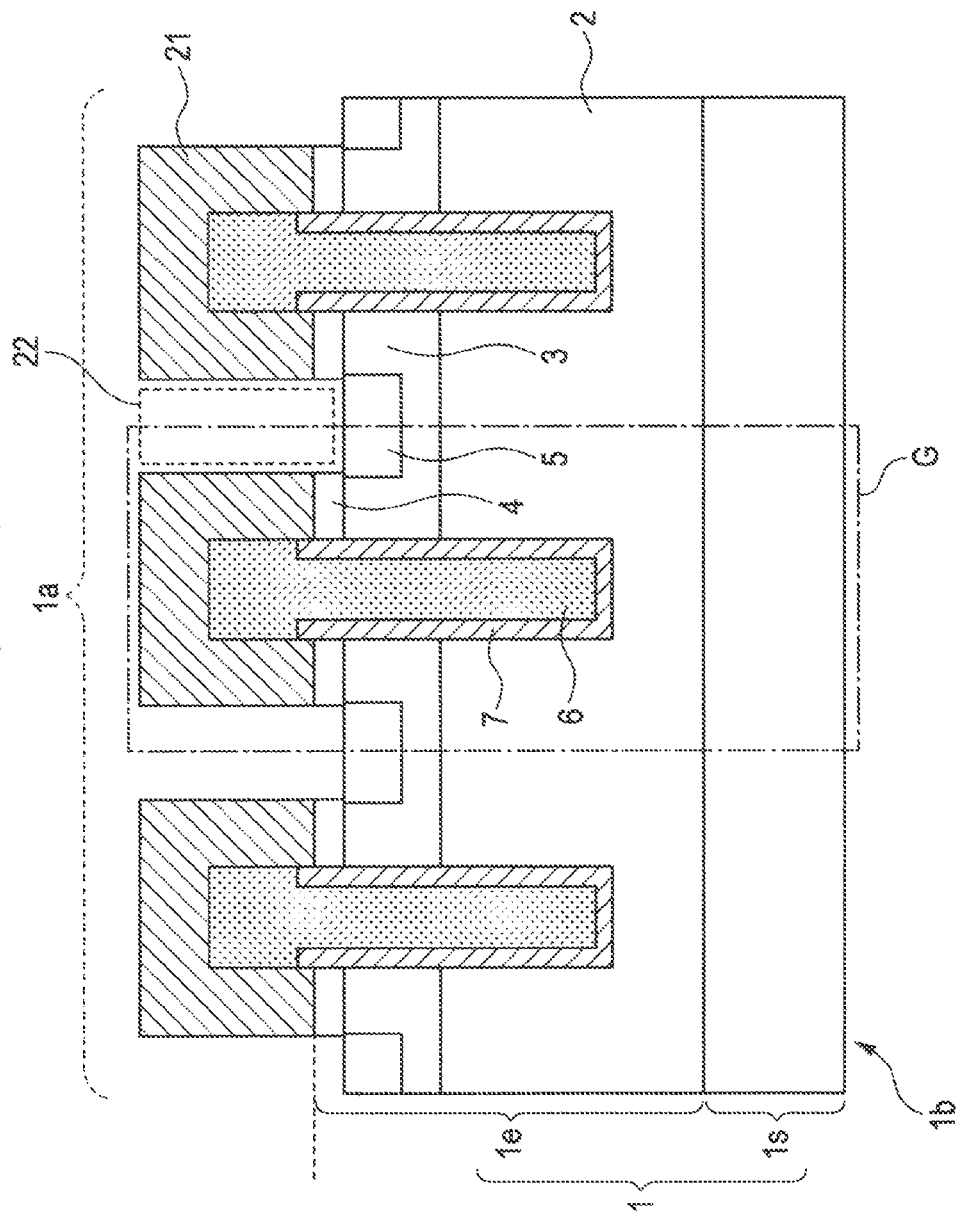
FIG. 20 is a device cross-sectional flow diagram (the step of introducing the p+ body contact regions) of the trench gate cell portion (corresponding to the X-X' cross section of FIG. 19) in the method of manufacturing the semiconductor device of the embodiment of the present invention.
Figure 21:
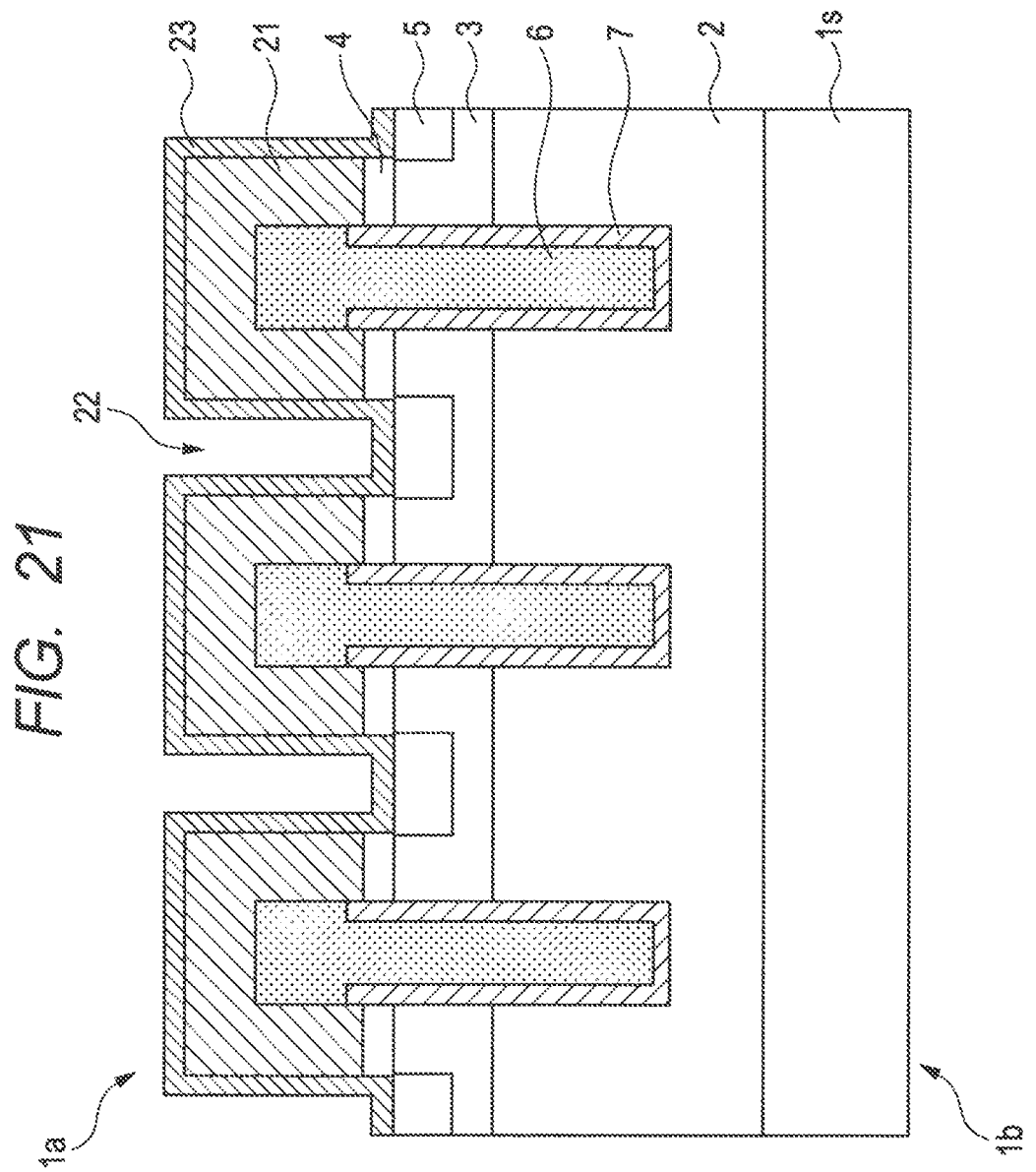
FIG. 21 is a device cross-sectional flow diagram (the step of depositing a barrier metal film) of the trench gate cell portion in the method of manufacturing the semiconductor device of the embodiment of the present invention.
Figure 22:
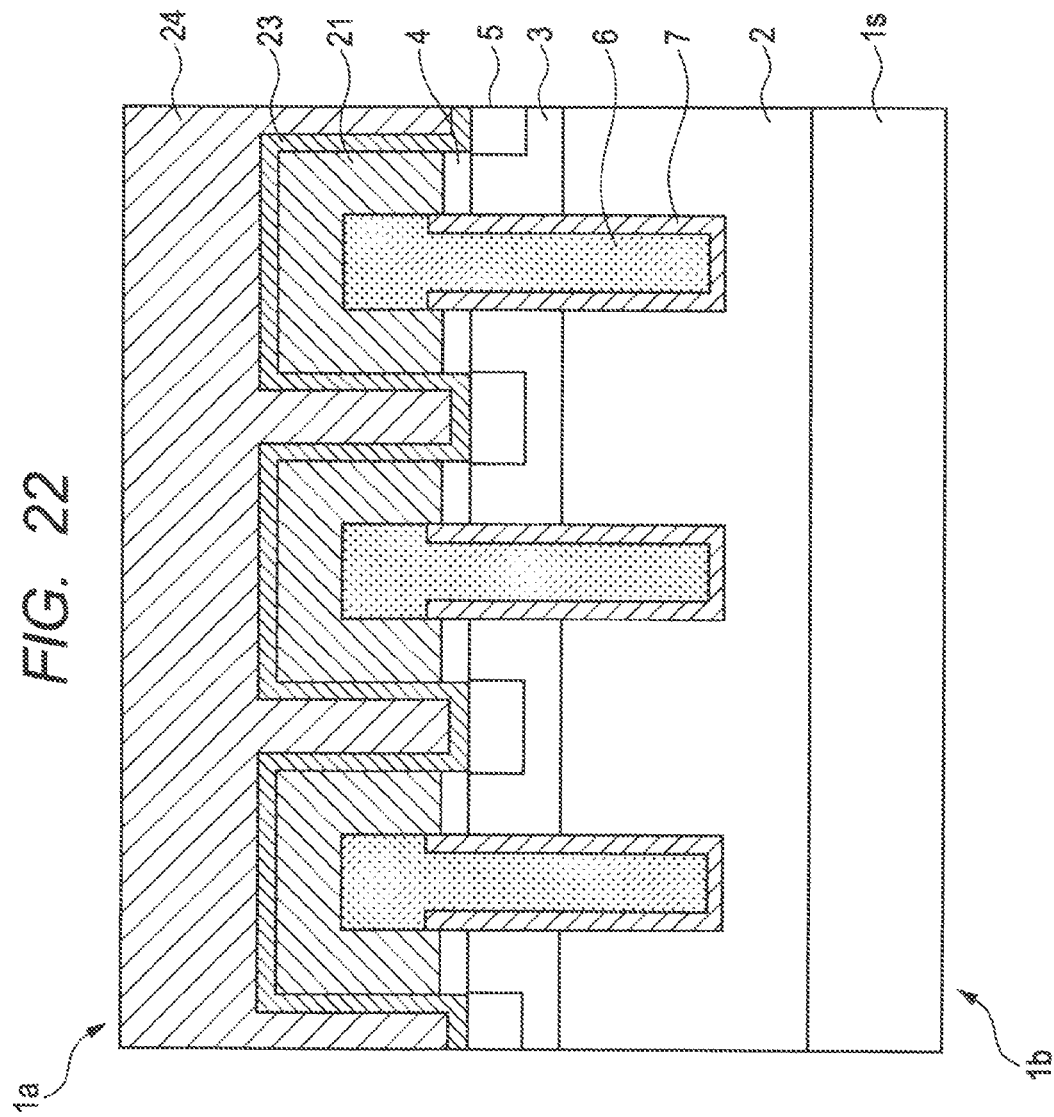
FIG. 22 is a device cross-sectional flow diagram (the step of depositing an aluminum-based metal film) of the trench gate cell portion in the method of manufacturing the semiconductor device of the embodiment of the present invention.
Figure 23:
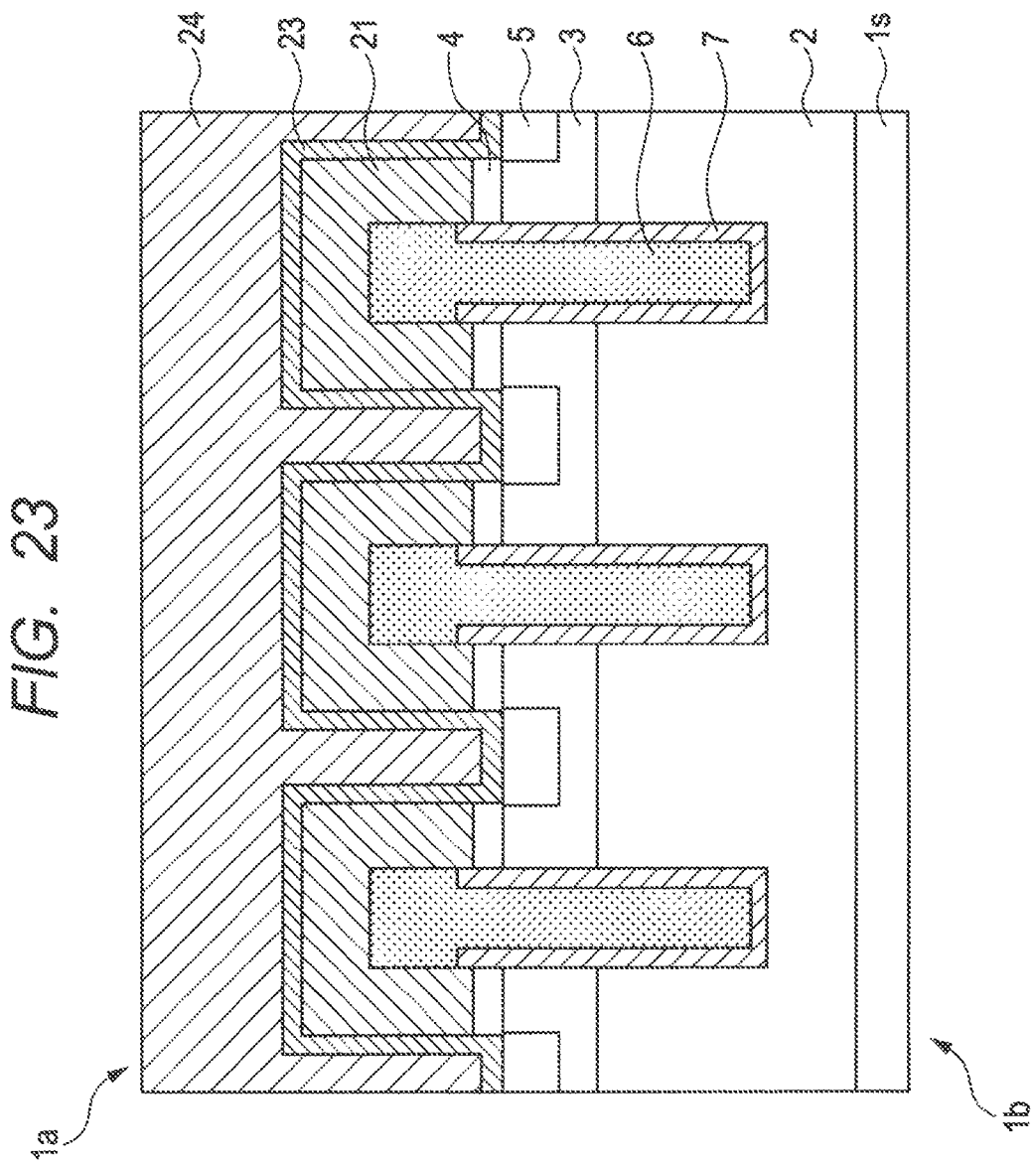
FIG. 23 is a device cross-sectional flow diagram (back grinding step) of the trench gate cell portion in the method of manufacturing the semiconductor device of the embodiment of the present invention.
Figure 24:
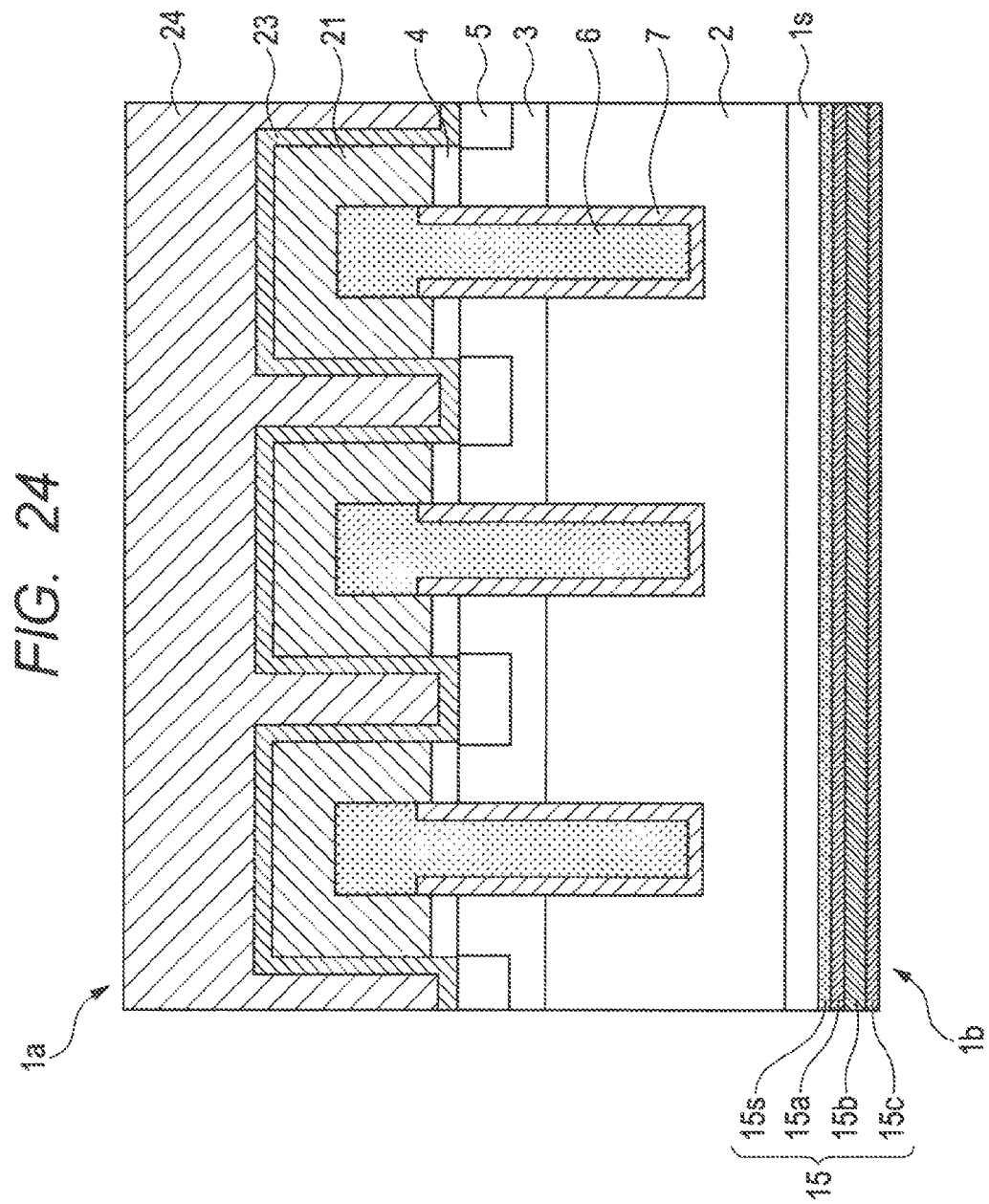
FIG. 24 is a device cross-sectional flow diagram (the step of depositing a back-side multilayer metal film) of the trench gate cell portion in the method of manufacturing the semiconductor device of the embodiment of the present invention.

FIG. 15 is a device cross-sectional flow diagram (the step of forming a resist pattern for forming source/contact trenches) of a trench gate cell portion in the method of manufacturing the semiconductor device of the embodiment of the present invention. FIG. 16 is a device cross-sectional flow diagram (the step of forming the source/contact trenches) of the trench gate cell portion in the method of manufacturing the semiconductor device of the embodiment of the present invention. FIG. 17 is a device cross-sectional flow diagram (the step of removing the resist pattern for forming the source/contact trenches) of the trench gate cell portion in the method of manufacturing the semiconductor device of the embodiment of the present invention. FIG. 18 is a device cross-sectional flow diagram (the step of extending the source/contact trenches) of the trench gate cell portion in the method of manufacturing the semiconductor device of the embodiment of the present invention. FIG. 19 is a device top view (the step of introducing p+ body contact regions) of the trench gate cell portion in the method of manufacturing the semiconductor device of the embodiment of the present invention. FIG. 20 is a device cross-sectional flow diagram (the step of introducing the p+ body contact regions) of the trench gate cell portion (corresponding to the X-X' cross section of FIG. 19) in the method of manufacturing the semiconductor device of the embodiment of the present invention. FIG. 21 is a device cross-sectional flow diagram (the step of depositing a barrier metal film) of the trench gate cell portion in the method of manufacturing the semiconductor device of the embodiment of the present invention. FIG. 22 is a device cross-sectional flow diagram (the step of depositing an aluminum-based metal film) of the trench gate cell portion in the method of manufacturing the semiconductor device of the embodiment of the present invention. FIG. 23 is a device cross-sectional flow diagram (back grinding step) of the trench gate cell portion in the method of manufacturing the semiconductor device of the embodiment of the present invention. FIG. 24 is a device cross-sectional flow diagram (the step of depositing a back-side multilayer metal film) of the trench gate cell portion in the method of manufacturing the semiconductor device of the embodiment of the present invention.

A description will be given herein to an example in which an n-type epitaxial wafer 1 obtained by forming an n-type epitaxial layer (having a thickness of, e.g., about 4 micrometers) in an $n^+$-type single-crystal silicon wafer (silicon-based wafer) having a diameter of 200 mm is used as a raw material wafer. However, the diameter of the wafer may also be 300 mm, 400 mm, or another value (it may also be possible to e.g., form an n+-type region in the back surface of an n-type single-crystal silicon wafer after back grinding). The conductivity type of the wafer may also be a p-type or the like. Also, the type of the wafer is not limited to an epitaxial wafer, and may also be another type of semiconductor substrate, insulating substrate, or the like. As necessary, the wafer may also be a semiconductor wafer or a substrate other than a silicon-based wafer.

As shown in FIG. 15, the semiconductor wafer 1 is mainly comprised of an n+ silicon substrate portion 1s and an epitaxial layer 1e. In the epitaxial layer 1e, there is an n-type drift region 2, which is an original n-type epitaxial layer. Over the n-type drift region 2, a p-type channel region (p-type base region) 3, an n+ source region 4, and the like are formed. A plurality of trench gate electrodes (polysilicon electrodes) 6 are periodically provided such that the upper portions thereof protrude from the epitaxial layer 1e. Around the middle lower portion of each of the trench gate electrodes 6, a gate insulating film 7 is provided. On the device surface 1a side of the semiconductor wafer 1, an interlayer insulating film 21 is formed to completely cover each of the trench gate electrodes 6. As an example of the interlayer insulating film 21, there can be shown a multilayer insulating film including, e.g., a silicon nitride film (silicon-nitride-based insulating film) having a thickness of, about 60 nm, a PSG film (silicon-oxide-based insulating film) having a thickness of about 300 nm, an SOG film (silicon-oxide-based insulating film) having a thickness of about 95 nm, and the like, which are mentioned in an ascending order.

Over the interlayer insulating film 21, a resist film 9 for processing is formed. When dry etching is performed using the resist film 9 as an etching mask, recessed portions (source contact trenches) 22 are formed, as shown in FIG. 16. Then, the resist film 9, which is no longer needed, is removed, resulting in a state as shown in FIG. 17.

Next, using the patterned interlayer insulating film 21 as an etching mask, dry etching is further performed so that, as shown in FIG. 18, the recessed portions (source contact trenches) 22 are extended to the upper end of the p-type channel region 33.

A device upper surface (wafer upper surface) corresponding to FIG. 18 (corresponding also to FIG. 20) at this time is shown in FIG. 19. In FIG. 19, a cell repetitive unit region G is shown in correspondence also to FIG. 20.

Subsequently to FIG. 18, as shown in FIG. 20, through the source contact trenches 22 (each having a trench bottom width of about 300 nm and a depth of about 850 nm, and an aspect ratio of about not less than 2 and not more than 5, which is about 2.8 on average), p+ body contact regions 5 are introduced into surface areas in the p-type channel region 3 by ion implantation.

Next, as shown in FIG. 21, over substantially the entire device surface 1a of the semiconductor wafer 1, a barrier metal film 23 is formed. Note that the barrier metal film 23 is formed of a lower-layer barrier metal film, an upper-layer barrier metal film, and the like. As the lower-layer barrier metal film (a part of which is a silicidized metal), not only titanium, but also TiW, Ta, W, WSi, or the like can be used. As the upper-layer barrier metal film, not only titanium nitride, but also TiW, TaN, or the like can be used.

Subsequently, silicidation anneal is performed. When the silicidation anneal is performed, the portion of the titanium film in contact with a silicon member is changed into a titanium silicide along the entire thickness thereof. However, to avoid complicated illustration, such a change is not shown.

Next, as shown in FIG. 22, over substantially the entire surface of the barrier metal film 23, an aluminum-based metal film 24 serving as source electrodes is deposited. Note that, as a material for the source electrodes, not only a silicon-added aluminum-based metal (AlSi) described herein, but also AlCu, pure Al, a copper-based metal member, or the like can be used.

Thereafter, the aluminum-based metal film 24 is patterned, and a final passivation insulating film (e.g., an organic insulating film such as a coated polyimide resin having a thickness of about 2 micrometers) is formed thereover, followed by the formation of a necessary opening therein.

Next, as shown in FIG. 23, a back grinding process (grinding process) is performed to reduce the original thickness (e.g., about 750 micrometers) of the wafer to about 100 to 280 micrometers (i.e., a value less than 300 micrometers). Note that the thickness of the thinned wafer can further be reduced if the wafer can be subjected to a subsequent process.

Next, as shown in FIG. 24, a multilayer metal film 15 (back-side metal electrode) is deposited by sputtering deposition over a back surface 1b of the wafer 1. The back-side metal electrode film 15 includes, e.g., a nickel silicide film 15s (formed for the purpose of, e.g., ensuring the strength or the like even in an assembly step), a back-side titanium film 15a (a diffusion prevention layer of gold and nickel), a back-side nickel film 15b (adhesive layer to a chip bonding material), a back-side gold film 15c (anti-oxidation layer of nickel), and the like, which are shown in order of increasing distance from the wafer 1. Thereafter, the wafer is divided into individual chips, resulting in a device as shown in FIG. 14.

The wafer-back-side multilayer metal deposition process will be described in greater detail in the next section.

3. Description of Metal Deposition Apparatus, etc. Used in Method of Manufacturing Semiconductor Device of Above Embodiment of Present Invention (See Mainly FIGS. 1 to 12)

In this section, a description will be further given to a wafer processing apparatus (multilayer sputtering deposition apparatus) used in the wafer-back-side multilayer metal deposition process described in the previous section using FIG. 24. Note that examples of a preferred commercially available apparatus for a 200-Φ wafer (having a diameter of about 200 millimeters) that can be shown include a multilayer sputtering deposition apparatus SRH-420 manufactured by ULVAC, Inc. and the like.

A characteristic feature of the apparatus described below is that it allows a multilayer metal film formation process or the like to be performed without using a reinforcing plate such as a glass plate thicker than the thinned wafer which is typically used in the processing of a thinned wafer (wafer having a thickness of about not more than 280 micrometers) and to which a wafer is bonded to be reinforced thereby. The apparatus is also advantageous in that, since the wafer can be subjected in an unrestricted state to a heating process or the like, an uneven temperature distribution resulting from the specifications of a pressing claw, a pressing jig, or the like can be avoided.

Figure 2:
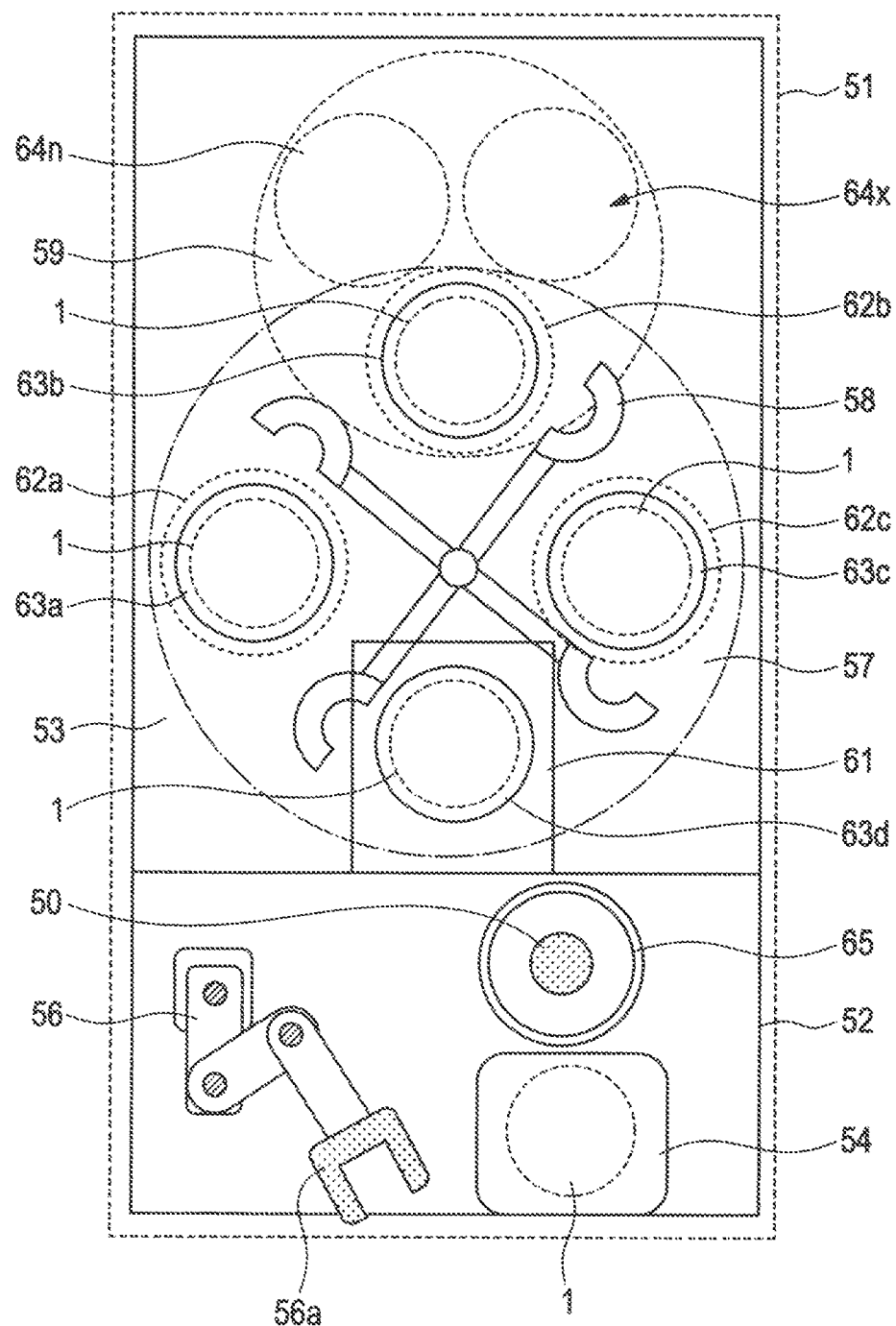
FIG. 2 is a top view (obtained by making transparent a target switching mechanism in FIG. 1 for clear illustration of a portion located thereunder) of the wafer-back-side multilayer metal deposition apparatus used for the method of manufacturing the semiconductor device of the embodiment of the present invention.
Figure 3:
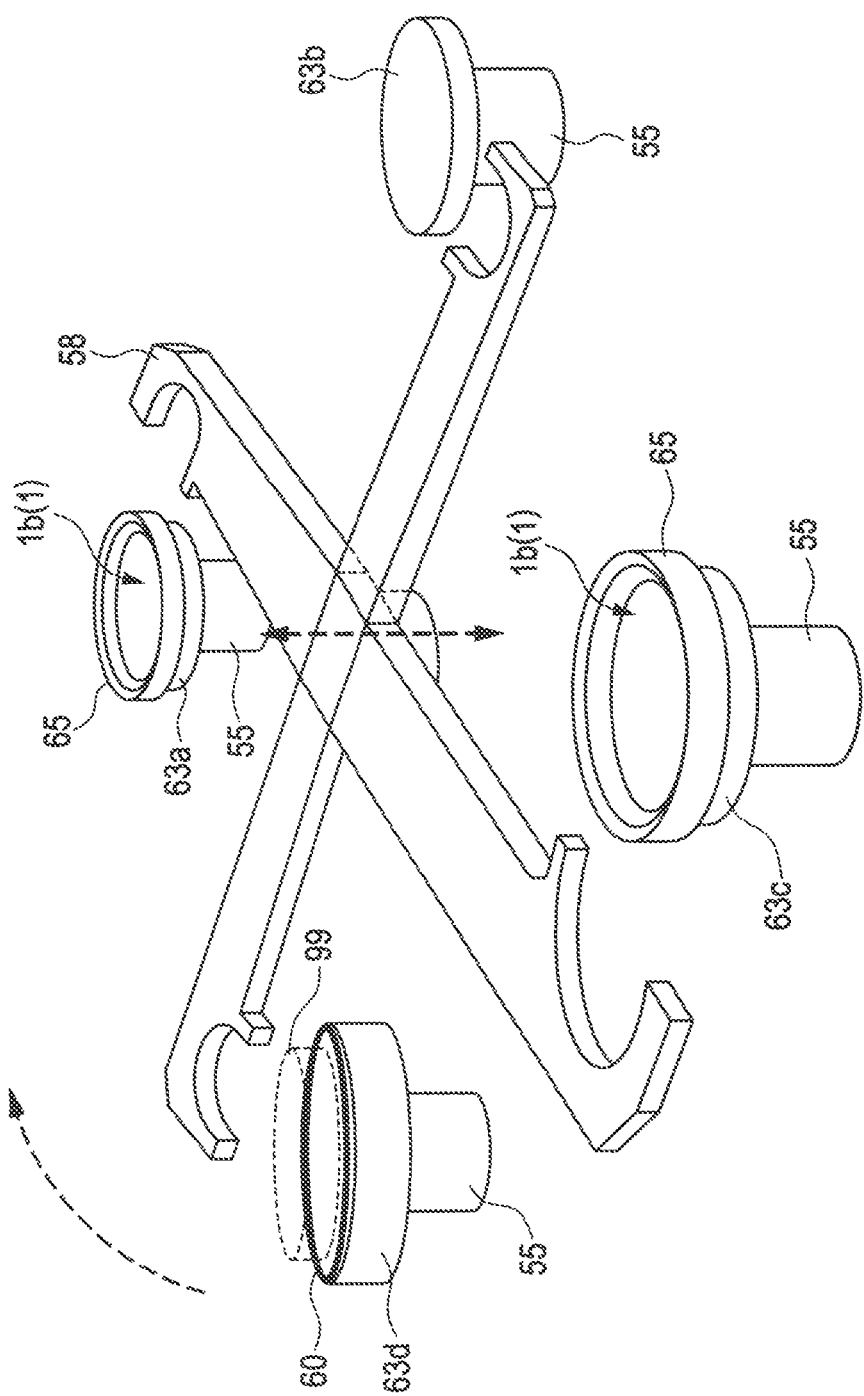
FIG. 3 is a perspective view of an internal transportation robot, individual wafer stages, wafers over the stages, and wafer susceptors for illustrating a manner in which the wafers move in the wafer-back-side multilayer metal deposition apparatus shown in FIGS. 1 and 2.
Figure 4:
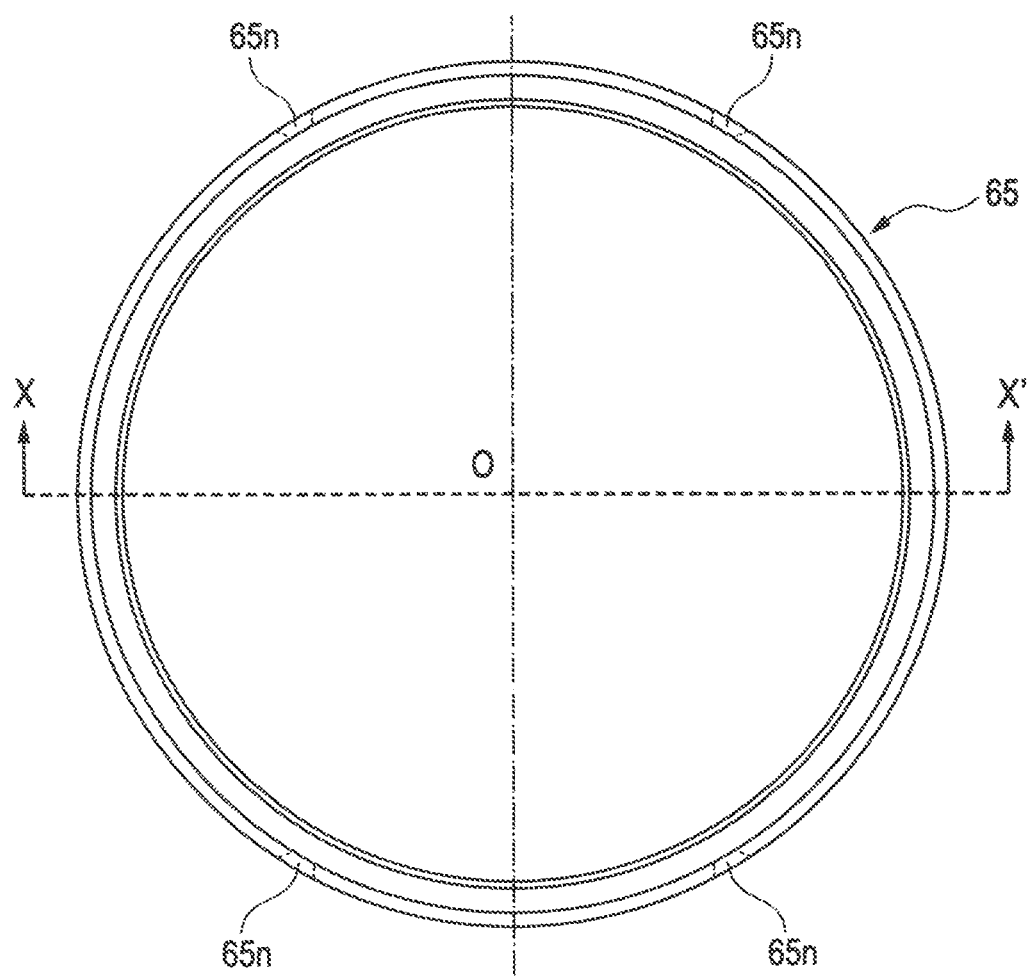
FIG. 4 is a top view of each of the wafer susceptors of FIG. 3.
Figure 9:
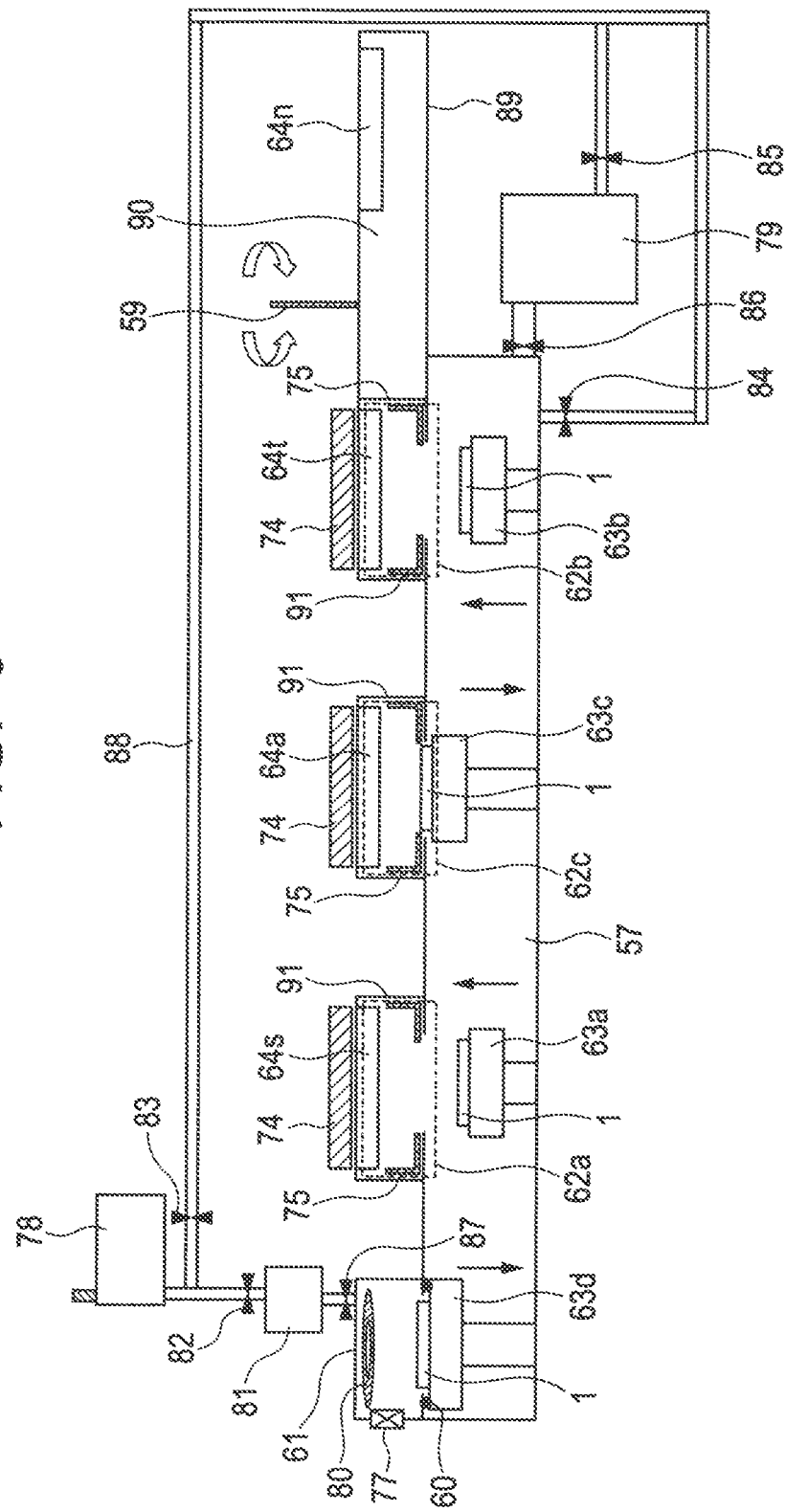
FIG. 9 is a schematic cross-sectional view when the wafer-back-side multilayer metal deposition apparatus shown in FIGS. 1 and 2 is developed into a laterally elongated shape to be easily viewed.
Figure 10:
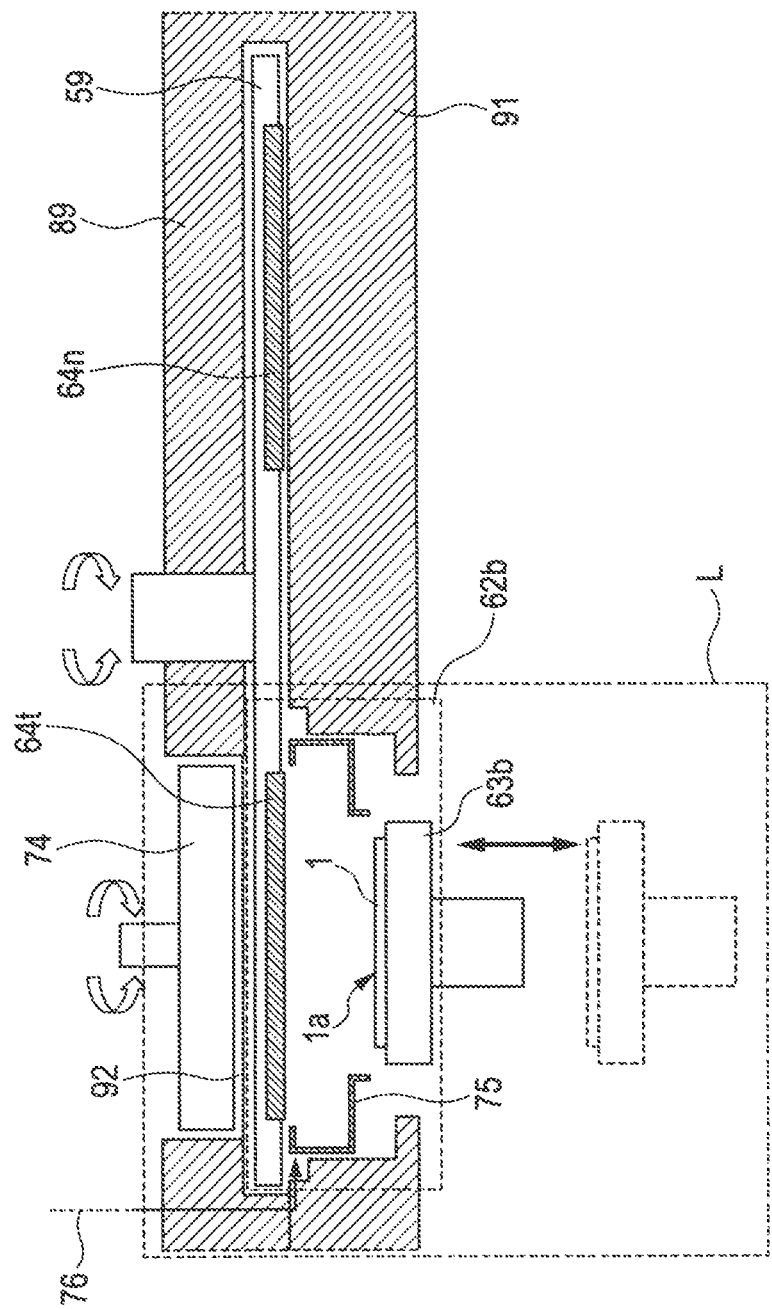
FIG. 10 is an enlarged cross-sectional view of the periphery of a multi-target deposition process area 62b in the wafer-back-side multilayer metal deposition apparatus of FIG. 9.
Figure 11:
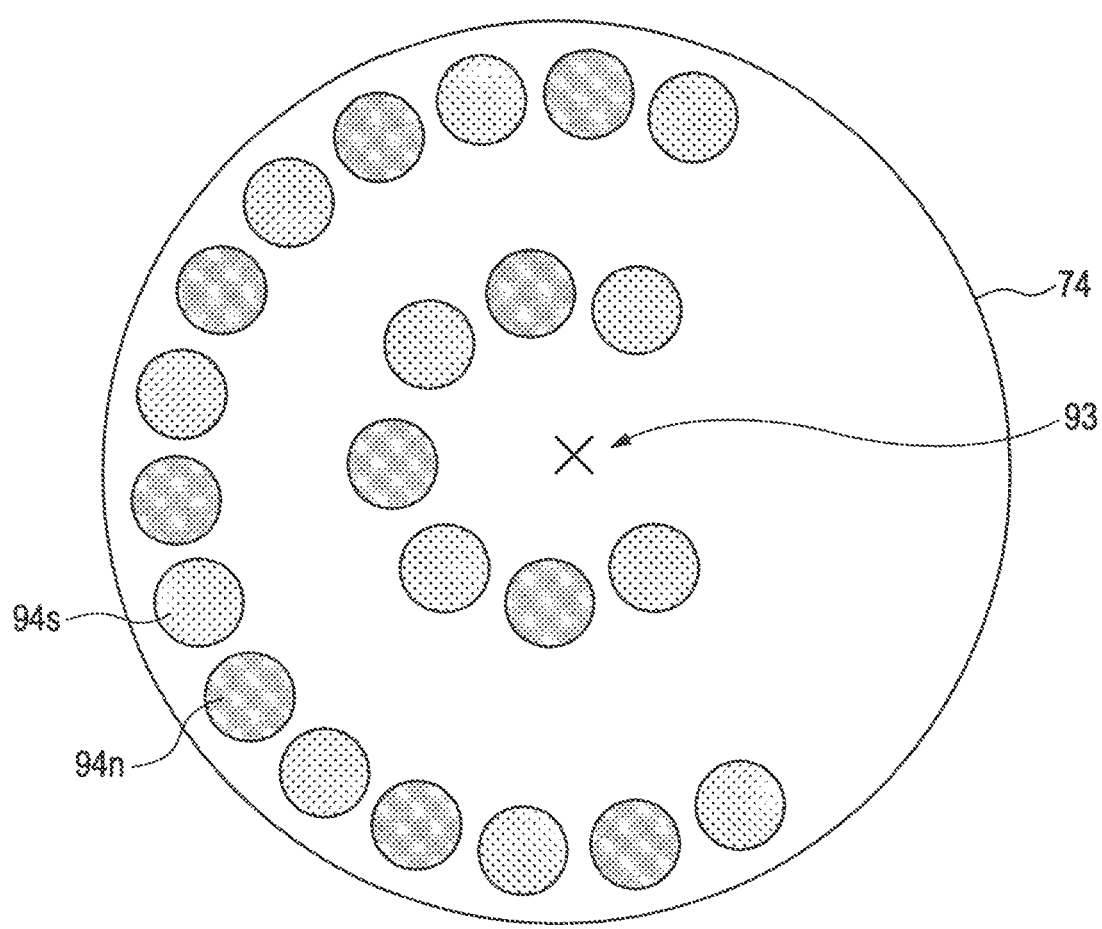
FIG. 11 is an enlarged bottom view of each of the magnetron magnet sets shown in FIGS. 9 and 10.
Figure 12:
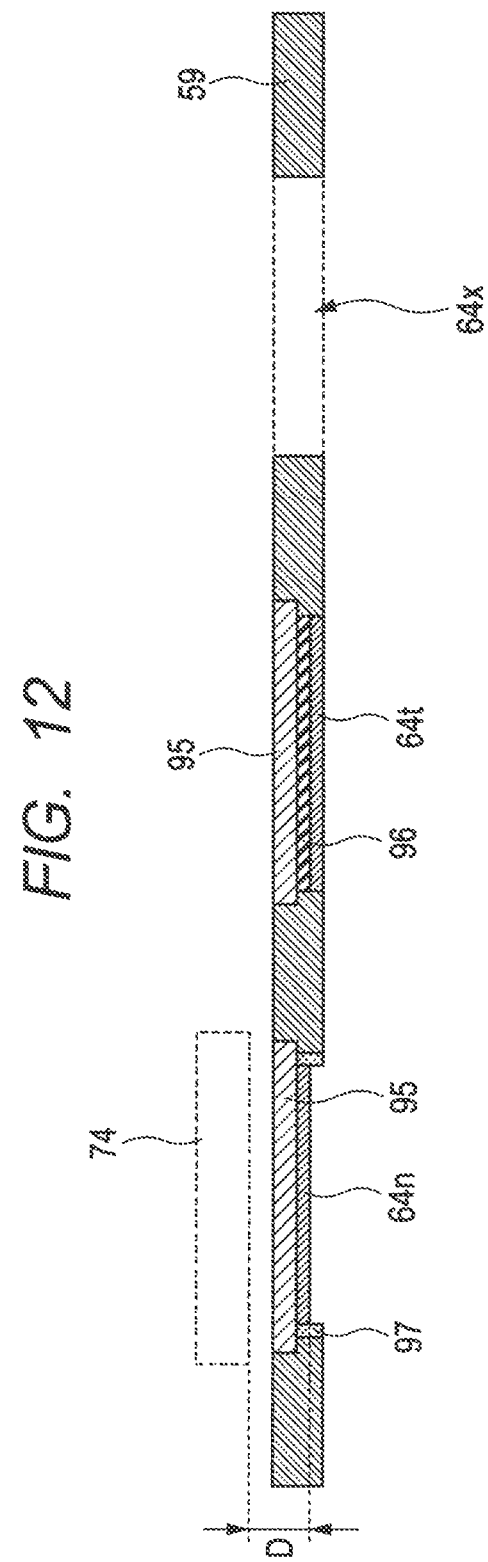
FIG. 12 is an enlarged cross-sectional view of a target switching mechanism 59 shown in FIGS. 9 and 10.
Figure 13:
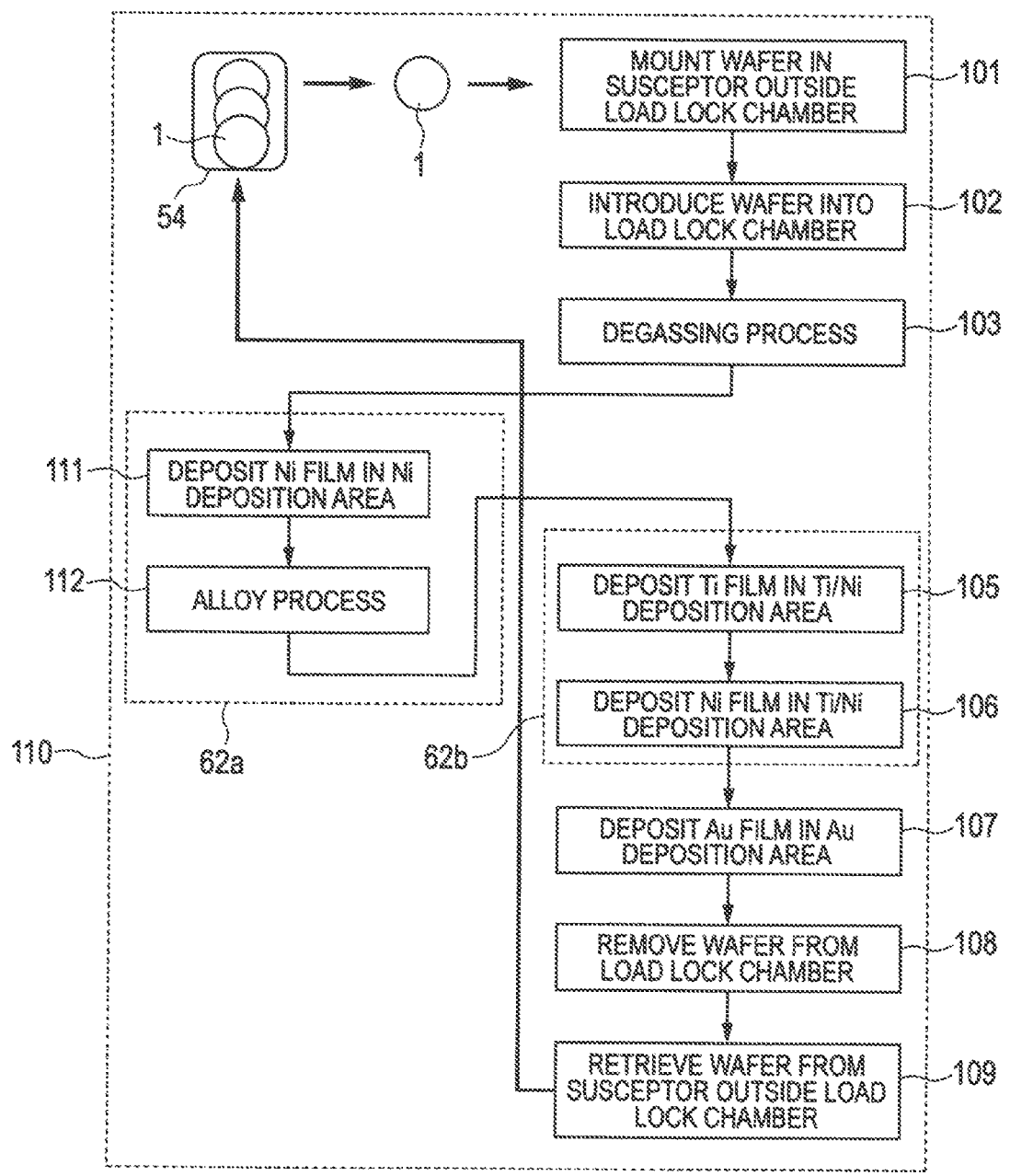
FIG. 13 is a process block flow chart of a wafer-back-side multilayer metal layer deposition process in the method of manufacturing the semiconductor device of the embodiment of the present invention.

FIG. 1 is a top view of a wafer-back-side multilayer metal deposition apparatus used for the method of manufacturing the semiconductor device of the embodiment of the present invention. FIG. 2 is a top view (obtained by making transparent a target switching mechanism in FIG. 1 for clear illustration of a portion located thereunder) of the wafer-back-side multilayer metal deposition apparatus used for the method of manufacturing the semiconductor device of the embodiment of the present invention. FIG. 3 is a perspective view of an internal transportation robot, individual wafer stages, wafers over the stages, and wafer susceptors for illustrating a manner in which the wafers move in the wafer-back-side multilayer metal deposition apparatus shown in FIGS. 1 and 2. FIG. 4 is a top view of each of the wafer susceptors of FIG. 3. FIG. 5 is a cross-sectional view of the wafer susceptor corresponding to the X-X' cross section of FIG. 4 (when held by the internal transportation robot). FIG. 6 is a front cross-sectional structural view of cooling wafer stages 63b and 63c in the wafer-back-side multilayer metal deposition apparatus shown in FIGS. 1 and 2. FIG. 7 is a front cross-sectional structural view of a lamp-heating wafer stage 63a in the wafer-back-side multilayer metal deposition apparatus shown in FIGS. 1 and 2. FIG. 8 is a front cross-sectional structural view (during a degassing process) of a load lock chamber 61 in the wafer-back-side multilayer metal deposition apparatus shown in FIGS. 1 and 2. FIG. 9 is a schematic cross-sectional view when the wafer-back-side multilayer metal deposition apparatus shown in FIGS. 1 and 2 is developed into a laterally elongated shape to be easily viewed. FIG. 10 is an enlarged cross-sectional view of the periphery of a multi-target deposition process area 62b in the wafer-back-side multilayer metal deposition apparatus of FIG. 9. FIG. 11 is an enlarged bottom view of each of the magnetron magnet sets shown in FIGS. 9 and 10. FIG. 12 is an enlarged cross-sectional view of a target switching mechanism 59 shown in FIGS. 9 and 10. FIG. 13 is a process block flow chart of a wafer-back-side multilayer metal layer deposition process in the method of manufacturing the semiconductor device of the embodiment of the present invention. Based on the above drawings, a description will be given to the metal deposition apparatus used in the method of manufacturing the semiconductor device of the above embodiment of the present invention, the wafer-back-side multilayer metal layer deposition process using the metal deposition apparatus, and the like.

First, using FIGS. 1 to 12, a description will be given to a structure of a single-chamber multilayer sputtering deposition apparatus 51 used in the wafer-back-side multilayer metal deposition process and the like. As shown in FIG. 1 or 2, the single-chamber multilayer sputtering deposition apparatus 51 includes a load port unit 52 and a deposition process unit 53. On the load port unit 52, a wafer transportation vessel or a wafer cassette 54 containing a wafer 1 to be processed can be placed. The wafer 1 to be processed is placed on a lift stage 50 with a device surface 1a thereof being held by a tip portion 56a (the upper surface thereof is formed of an elastic pad) of an external robot 56. Then, the lift stage 50 moves down to set the wafer 1 in each of wafer susceptors 65 (made of a metal or heat resistant inorganic material). Here, as necessary, the orientation (direction of a notch or an orientation flat) of the wafer 1 is adjusted. Note that, as the material of the susceptors 65, a metal such as stainless steel or a heat resistant inorganic material such as quartz, silicon, or SiC can be used. However, for a process involving heating to a temperature of not less than 250 degrees Celsius as performed in a fourth section, in terms of uniformizing a heat distribution over the wafer, a heat resistant inorganic material is preferred. Also, among heat resistant inorganic materials, quartz (heat resistant insulator) is particularly effective because of its low heat conductivity. Therefore, in the present invention, the susceptors 65 are each made of quartz unless described otherwise.

In the deposition process unit 53, a load lock chamber 61 and a sputtering deposition process chamber 57 are provided, and the load lock chamber 61 can be spatially independent of the outside thereof. In the sputtering deposition process chamber 57, single-target deposition process areas 62a and 62c and a multi-target deposition process area 62b are provided and, correspondingly thereto, a lamp-heating wafer stage 63a and cooling wafer stages 63b and 63c are provided.

Also, in the sputtering deposition process chamber 57, a wafer stage with vacuum flange 63d is provided correspondingly to the load lock chamber 61, and an internal transportation robot 58 for transporting the wafer 1 between the wafer-stage with vacuum flange 63d and the wafer stages 63a, 63b, and 63c is provided.

Also, in the deposition process unit 53, a target switching mechanism 59 (upper electrode or cathode) for switching targets in the multi-target deposition process area 62b is provided. In the target switching mechanism 59, e.g., a titanium target 64t (non-magnetic target), a nickel target 64n (magnetic target), and the like are set. Typically, in the target switching mechanism 59, i.e., target holding rotating table, three targets can be set, and one vacant position 64x is present herein.

Next, a further description will be given to the internal transportation robot 58, the wafer susceptors 65, the wafer stages 63a, 63b, and 63c, and the like. As shown in FIG. 3, the internal transportation robot 58 can vertically move and rotate in both directions, and can simultaneously transport the four wafer susceptors 65 (in each of which the wafer 1 is set). At this time, the wafer 1 is contained in each of the wafer susceptors 65 with the back surface 1b thereof facing upward. The wafer stages 63a, 63b, and 63c over respective stage support stands 55 have various structures as required. For example, the wafer stage 63d for the load lock chamber 61 (degassing chamber) has a flange portion in which an O-ring 60 can be set, and is provided with a metal stage 99 for raising the height of the wafer 1 and the like.

Next, using FIGS. 4 and 5 (the X-X' cross section of FIG. 4), a description will be given to a detailed structure of each of the wafer susceptors 65. As shown in FIG. 4, the wafer susceptor 65 is formed of an annular metal (e.g., stainless steel) or a heat resistant inorganic material (e.g., quartz), and displacement prevention notches 65n are provided in the periphery thereof to prevent the displacement of the wafer during transportation and during a deposition process. Here, when the entire multilayer deposition process involves a process at a temperature of not less than 250 degrees Celsius, the susceptor 65 made of, e.g., quartz is used. When the entire multilayer deposition process does not involve a process at a temperature of not less than 250 degrees Celsius, the susceptor 65 made of, e.g., stainless steel (made of, e.g., austenite-based non-magnetic stainless steel) is used.

FIG. 5 shows a cross section of the wafer susceptor 65 holding the wafer 1 held by the internal transportation robot 58. As shown in FIG. 5, the wafer 1 has a peripheral portion thereof held by the internal flat portion of the wafer susceptor 65 with the back surface 1b thereof facing upward, while the wafer susceptor 65 has a peripheral portion thereof held by the tip portion of the internal transportation robot 58.

Next, using FIG. 6, a description will be given to a cross-sectional structure of each of the non-heating stages 63b and 63c. As shown in FIG. 6, an electrostatic chuck 68 made of a ceramic and having an internal electrode is provided via a metal spacer 67 made of, e.g., copper over a water-cooling holder portion 66 (cooling base metal plate) similarly made of, e.g., copper. Over the electrostatic chuck 68, a wafer surface protection layer 70 such as, e.g., a polyimide film is provided so as not to damage the device surface 1a of the wafer 1. The wafer susceptor 65 is held over the cooling base metal plate 66 via a susceptor-positioning insulating ring 69a. In that state, the wafer 1 is supported by the wafer surface protection layer 70, while being spaced apart from the wafer susceptor 65.

Next, a description will be given to a cross-sectional structure of the lamp-heating wafer stage 63a using FIG. 7. As shown in FIG. 7, a reflection plate 73 is provided over the stage support stand 55. Around the reflection plate 73, a wafer holder base 71 made of a metal is provided. Over the opening of the wafer holder base 71, a quartz window 98 is provided. Between the quartz window 98 and the reflection plate 73, a lamp heater 72 is provided. Over the wafer holder base 71, the wafer susceptor 65 is placed via a susceptor-positioning insulating ring 69b. In the wafer susceptor 65, the wafer 1 is held with the back surface 1b thereof facing upward.

Next, a description will be given to a cross-sectional structure (in a state cut off from the outside) of the load lock chamber 61 using FIG. 8 (see FIG. 3). As shown in FIG. 8, the load lock chamber 61 is cut off from the other portion by the wafer stage with vacuum flange 63d having the O-ring 60 similarly to a wafer gate 77 having the O-ring 60. Over the load lock chamber 61, a gas supply line 76 (gas supply nozzle) is provided. Immediately below the gas supply line 76, a wafer-back-side heating mechanism 80 including the reflection plate 73, the lamp heater 72, the quartz window 98, and the like is also provided. Over the wafer stage with vacuum flange 63d, the wafer susceptor 65 is placed via the metal stage 99. At this time, the wafer 1 is held in the wafer susceptor 65, and spaced apart from the metal stage 99.

Next, using FIG. 9, a further description will be given to the vacuum system of the wafer processing apparatus (multilayer sputtering deposition apparatus), the load lock chamber 51 (degassing chamber) 61, the sputtering deposition process chamber 57, the deposition process areas 62a, 62b, 62c, and the like. As shown in FIG. 9, the respective main portions of the wafer stages 63a, 63b, 63c, and 63d are in the sputtering deposition process chamber 57 to be vertically movable. The load lock chamber 61 is configured to be spatially independent of the deposition process chamber 57 by the rising of the wafer stage 63d. On the other hand, the deposition process areas 62a, 62b, and 62c are each brought into a state where processing on the wafer 1 can be performed by the rising of the respective wafer stages 63a, 63b, and 63c, but the deposition process areas 62a, 62b, and 62c and the other portion of the deposition process chamber 57 are not spatially independent, but basically have substantially equal air pressures.

Next, a description will be given to the vacuum system. As shown in FIG. 9 (note that, in FIGS. 9 and 10, the wafer susceptors 65 are omitted for the convenience of illustration), the load lock chamber 61 is evacuated by the vacuum system (load lock vacuum system) formed of a turbo molecular pump 81, a dry roughing pump 78, and the like. During the operation of the load lock vacuum system, a load lock evacuation valve 87 and a molecular pump valve 82 are in an open state. At this time, the vacuum system (deposition process chamber vacuum system) of the deposition process chamber 57 is also normally in an operating state. The deposition process chamber vacuum system is mainly formed of a cryopump 79. During the operation of the cryopump 79, a main exhaust valve 86 is in the open state, while a roughing valve 84, a cryopump exhaust valve 85, a dry pump valve 83, and the like are in a closed state. Note that, in rough evacuation when exhaust using the cryopump 79 is initiated, the main exhaust valve 86 and the cryopump exhaust valve 85 are brought into the closed state, while the roughing valve 84, the dry pump valve 83, and the like are brought into the open state, and rough evacuation is performed by means of the dry roughing pump 78 via an exhaust tube 88 (evacuation exhaust system). Here, in a normal state, the molecular pump valve 82 and the dry pump valve 83 are not simultaneously brought into the open state.

Next, a description will be given to the respective structures of the deposition process areas 62a, 62b, and 62c. As shown in FIG. 9, each of the deposition process areas 62a and 62c has, a main portion thereof, a cylindrical room-like section (room-like section or cylindrical section) having an open bottom, in which an inner wall 91 of the deposition process chamber 57 partly protrudes toward the outside. In the cylindrical section, a film deposition prevention shield 75 (set to a ground potential when used) is provided. Inside the respective upper portions of the cylindrical sections, e.g., a nickel target 64s (magnetic target) and a gold target 64a (non-magnetic target), each for forming a silicide film, or upper electrodes (cathode electrodes) for the attachment thereof are provided. On the other hand, outside the respective upper portions of the cylindrical sections, respective magnetron magnet sets (magnet-mounted rotating plates) 74 are provided.

As shown in FIG. 9, similarly to the deposition process areas 62a and 62c, the deposition process area 62b has, a main portion thereof, a cylindrical room-like section (room-like section or cylindrical section) having an open bottom, in which the inner wall 91 of the deposition process chamber 57 partly protrudes toward the outside. In the cylindrical section, the film deposition prevention shield 75 (set to a ground potential when used) is similarly provided. Here, for switching use of the plurality of targets, the deposition process area 62b is provided with an extended section 90 spatially coupled to the cylindrical section to contain the target switching mechanism 59 (upper electrode or cathode). In the extended section 90, the magnetron magnet set (magnet-mounted rotating plate) 74, the titanium target 64t (non-magnetic target), and the nickel target (magnetic target) 64n, each forming the cathode, are disposed, in the same manner as described above. Since the structure thereof is complicated, a description will be given using an enlarged view of FIG. 10.

As shown in FIG. 10, the wall surface (made of, e.g., an aluminum-based metal) of this portion of the deposition process chamber 57 has a double structure of the inner wall 91 and an outer wall 89. Between the inner wall 91 and the outer wall 89, the target switching mechanism 59 is contained to be horizontally rotatable. The target switching mechanism 59 includes a target holding plate capable of rotating, while holding the plurality of targets at the lower surface thereof, a rotation mechanism therefor, and the like. Outside the outer wall 89, the magnetron magnet set 74 (magnet-mounted rotating plate) is provided via a magnet-target separating wall 92 so as to be rotated by a rotation mechanism during the processing of the wafer. On the upper surface side of the cylindrical section of the multi-target deposition process area 62b, the nozzle 76 (gas supply line) for gas supply is provided.

Note that the structure of each of the other deposition process areas 62a and 62c is substantially the same as the structure of a peripheral portion L of the single-target deposition process area of FIG. 10. However, in the case of the other deposition process areas 62a and 62c, the targets are fixed, and do not move. The other portions, i.e., the film deposition prevention shield 75, the gas supply nozzle 76, the magnetron magnet set 74, the magnet-target separating wall 92 (made of, e.g., austenite-based non-magnetic stainless steel), and the like have substantially the same structures.

Next, a description will be given to a detailed structure of each of the magnetron magnet sets 74 of FIG. 10 and the other drawings (the same as each of the magnetron magnet sets 74 of FIG. 9) using FIG. 11 (an enlarged bottom view of the magnet-mounted rotating plate). As shown in FIG. 11, over the metal plate 74 (made of, e.g., austenite-based non-magnetic stainless steel), circular permanent magnets 94n and 94s are arranged in a letter-C shape on, e.g., two concentric circles sharing a rotation center 93. At this time, the permanent magnets 94n and 94s are arranged along the circumferences of the concentric circles such that the surfaces thereof alternately serve as N poles and S poles to form a confined magnetic field.

Next, a description will be given to a detailed cross-sectional structure of each of the target-mounted rotating plates, which are the main portion of the target switching mechanism 59 of FIG. 10. As shown in FIG. 12, the target-mounted rotating plate 59 (made of, e.g., copper) is provided with, e.g., three circular openings, and the targets are fitted therein as necessary. Here, as the magnetic target, the nickel target 64*n* (having a diameter of, e.g., about 290 millimeters and a thickness of, e.g., about 5 millimeters) is fitted and, as the non-magnetic target, the titanium target 64*t* (having a diameter of, e.g., about 304 millimeters and a thickness of, e.g., about 12 millimeters) is fitted. The both targets are fitted via backing metal plates 95 (first and second backing plates each made of, e.g., copper and having a diameter of, e.g., about 360 millimeters and a thickness of, e.g., about 5 millimeters). As examples of a distance D (distance from the lower end of each of the magnetron magnet sets and the lower surface of the corresponding target) between the magnet targets, e.g., about 22 millimeters can be shown for the nickel target 64*n* (magnetic target) and, e.g., about 29 millimeters can be shown for the titanium target 64*t* (non-magnetic target).

Note that, on the periphery of the magnetic target 64*n*, the magnetic field may be weaker. In that case, if the diameter of the target is set smaller than the diameter of the backing plate, such a problem can be avoided. Over the periphery of the target having such a smaller diameter, an undesired film may be deposited. In that case, if a deposition prevention ring 97 (made of, e.g., austenite-based non-magnetic stainless steel) is provided to prevent film deposition, such a problem can be avoided. It will be appreciated that such countermeasures are not mandatory.

If a sufficient magnetic field is to be ensured at the lower surface of the magnetic target 64*n*, the magnetic field may be excessively intense at the lower surface of the non-magnetic target 64*t*. In that case, if a spacer plate 96 (made of, e.g., copper and having a diameter of, e.g., about 304 millimeters and a thickness of, e.g., about 0.5 millimeters) is interposed between the backing plate 95 and the non-magnetic target 64*t*, such a problem can be avoided. It will be appreciated that such countermeasures are not mandatory.

4. Description of Wafer-Back-Side Multilayer Metal Film Deposition Process (Example of Power MOS-Type Device), etc. in Method of Manufacturing Semiconductor Device of Above Embodiment of Present Invention (See FIGS. 1 to 12, 23, and 24, and Mainly FIG. 13)

In this section, using a power MOS-type device (the back-side electrode structure thereof is shown in FIG. 24) as an example, a description will be given to a wafer-back-side multilayer metal layer deposition process using the multilayer sputtering deposition apparatus 51 illustrated in the third section.

FIG. 13 is a process block flow chart of the wafer-back-side multilayer metal layer deposition process in the method of manufacturing the semiconductor device of the embodiment of the present invention. Based on the drawing, a description will be given to the wafer-back-side multilayer metal layer deposition process and the like in the method of manufacturing the semiconductor device of the above embodiment of the present invention.

As shown in FIGS. 13 and 1, when the wafer 1 to be processed in the state of FIG. 23 is received by the load port unit 52 of the multilayer sputtering deposition apparatus 51 while being contained (e.g., contained with the back surface 1*b* of the wafer 1 facing upward) in the wafer transportation vessel 54, the wafer 1 to be processed is retrieved from the wafer transportation vessel 54 by the external robot 56, and placed on the lift stage 50 with the back surface thereof facing upward. Then, the lift stage 50 moves down, and the wafer 1 is contained in one of the wafer susceptors 65 (step 101 of mounting the wafer 1 in the susceptor). At this time, the wafer 1 contained in the susceptor 65 is in the freely placed state.

Next, as shown in FIG. 8, the wafer susceptor 65 having the wafer 1 mounted therein is introduced by the external robot 56 into the load lock chamber 61 via the wafer gate 77, and placed over the wafer stage 63*d* with the back surface 1*b* of the wafer 1 facing upward (step 102 of introducing the wafer 1 into the load lock chamber). At this time also, the wafer 1 contained in the susceptor 65 is in the freely placed state. At this time, when there is another previously processed wafer in the load lock chamber 61, the retrieval of the other wafer 1 is performed first. The time required to set the wafer in the susceptor and in the load lock chamber and retrieve the wafer from the load lock chamber and from the susceptor is, e.g., about one minute and forty seconds.

Next, by the closing of the wafer gate 77 and the initiation of evacuation of the load lock chamber 61, a degassing process 103 is performed. Specifically, by the evacuation, the degree of vacuum is first increased to a value of, e.g., about $5\times10^{-3}$ Pa or more (the required time is about 30 seconds). Subsequently, the lamp 72 is turned on to increase the temperature of the wafer 1 to a level of about 200 degrees Celsius. In this state (lamp heating and the evacuation are continued), the degassing process (process of removing water from over the wafer) is performed for, e.g., about 50 seconds. When the degassing process 103 is completed, the lamp 72 is turned off. Consequently, a process time related to the load lock chamber 61 is, e.g., about 3 minutes (load-lock-related unit process time) per wafer.

Next, in FIG. 8, the wafer stage 63*d* moves down (at this time, the other stages 63*a*, 63*b*, and 63*c* also simultaneously move down), and the wafer susceptor 65 having the wafer 1 mounted therein is transported by the internal transportation robot 58 onto the wafer stage 63*a* (in this case, to a standby stage) in the manner shown in FIG. 3. At this time, when there are the wafer susceptors 65 in which other wafers are placed on the wafer stages 63*a*, 63*b*, and 63*c*, the wafer susceptors 65 are also simultaneously moved onto the subsequent stages.

As shown in FIGS. 7 and 9, when the wafer 1 mounted in the wafer susceptor 65 is placed on the lamp heating wafer stage 63*a*, the wafer stage 63*a* moves up and the lamp heater 72 is turned on so that a preliminary heating step (the temperature of the wafer is, e.g., about 350 degrees Celsius (temperature higher than 250 degrees Celsius), and a preliminary heating time is about 60 seconds) is performed. Note that, normally, the warping of the wafer 1 becomes maximal at this time. At this time, the wafer 1 contained in the susceptor 65 is in the freely placed state.

Subsequently, a Ni deposition step 111 (FIG. 13) of depositing a nickel film (first metal film) for silicide formation by sputtering deposition is performed in the existing state. Examples of deposition conditions that can be shown include, e.g., a film thickness of about 50 nm, a process time of about 10 seconds, a DC power of about 4 kilowatts, an argon flow rate of about 10 sccm, a gas pressure of about 0.4 Pa, and a wafer temperature of about 350 degrees Celsius.

Subsequently, in the existing state except that the DC power is turned off, an alloy process 112 (FIG. 13), i.e., the process of silicidation for the nickel silicide film 15*s* (FIG. 24) is performed. Examples of alloy process conditions that can be shown include, e.g., a process time of about 60 seconds, an argon flow rate of about 10 sccm, a gas pressure of about 0.4 Pa, and a wafer temperature of about 350 degrees Celsius.

When the alloy process 112 is completed, the lamp heater 72 is turned off and, in that state, the completion of processing of the other wafers is awaited (referred to as a "preliminary standby step"). During the preliminary standby step, when a process gas such as argon gas is stopped, the degree of vacuum in the entire sputtering deposition process chamber 57 may increase. In such a case, if a process gas such as argon gas at the same flow rate level as in the deposition process is continuously allowed to flow (in this case, at an argon flow rate of, e.g., about 10 sccm), such a problem can be avoided, though continued supply of the process gas is not mandatory. When the preliminary standby step is completed, in the same manner as described above, the wafer 1 is moved by the internal transportation robot 58 onto the cooling wafer stage 63b, while being mounted in the wafer susceptor 65, simultaneously with the movement of the other wafers being processed.

Then, the cooling wafer stage 63b shown in FIG. 9 moves up, and the deposition of the titanium film is performed by sputtering deposition in the multi-target deposition process area 62b (step 105 of depositing a titanium film of FIG. 13). Examples of deposition conditions that can be shown include, e.g., a film thickness of about 100 nm, a process time of about 15 seconds, a DC power of about 8 kilowatts, an argon flow rate of about 15 sccm, and a gas pressure of about 0.3 Pa. Here, the settings of the wafer stage and the like are such that the electrostatic chuck is in an OFF state and the wafer stage is in a room-temperature water-cooling state. When the titanium deposition step 105 is completed, the DC power is temporarily turned off.

Subsequently, in the settings of the wafer stage and the like, the electrostatic chuck is brought into an ON state (the applied voltage is, e.g., about 2 kilovolts), while the wafer stage is held in the room-temperature water-cooling state, and the target is switched to the nickel target 64n so that the deposition of the nickel film (second metal film) by sputtering deposition is performed (step 106 of depositing a nickel film of FIG. 13). Examples of deposition conditions that can be shown include, e.g., a film thickness of about 200 nm, a process time of about 35 seconds, a DC power of about 4 kilowatts, an argon flow rate of about 10 sccm, and a gas pressure of about 0.4 Pa. At this time, the wafer 1 contained in the susceptor 65 is in the restrained state.

In the nickel deposition step 106, in a normal state, the wafer 1 is attracted by suction by the electrostatic chuck of the cooling wafer stage 63b in a state slightly floating from the susceptor 65, as shown in FIG. 6. At this time, if the placement of the wafer 1 in the susceptor 65 is not normal, the wafer may be destroyed by the suction attracting operation (see FIG. 30).

When the nickel deposition step 106 is completed, the DC power and the voltage applied to the electrostatic chuck are turned off and, in that state, the completion of processing of the other wafers is awaited (referred to as a "preliminary standby step"). During the preliminary standby step, when a process gas such as argon gas is stopped, the degree of vacuum in the entire sputtering deposition process chamber 57 may increase. In such a case, if a process gas such as an argon gas at the same flow rate level as in the deposition process is continuously allowed to flow (in this case, at an argon flow rate of, e.g., about 15 sccm), such a problem can be avoided, though continued supply of the process gas is not mandatory. Note that, with regard to this point, the same also holds true in the standby step 104 in the single-target deposition process area 62a (standby region) mentioned above. If the argon gas is continuously allowed to flow at an argon flow rate of, e.g., about 10 sccm, such a problem can also be similarly avoided. When the preliminary standby step in the multi-target deposition process area 62b is completed, in the same manner as described above, the wafer 1 is moved by the internal transportation robot 58 onto the cooling wafer stage 63c, while being mounted in the wafer susceptor 65, simultaneously with the movement of the other wafers being processed.

Next, as shown in FIG. 9, the cooling wafer stage 63c moves up, and a step 107 of depositing a gold film by sputtering deposition (FIG. 13) is performed in the single-target deposition process area 62c. Examples of deposition conditions that can be shown include, e.g., a film thickness of about 100 nm, a process time of about 15 seconds, a DC power of about 2 kilowatts, an argon flow rate of about 15 sccm, and a gas pressure of about 0.6 Pa. When the gold deposition step 107 is completed, the DC power is turned off and, in that state, the completion of processing of the other wafers is awaited (referred to as a preliminary standby step). During the preliminary standby step, when a process gas such as argon gas is stopped, the degree of vacuum in the entire sputtering deposition process chamber 57 may increase. In such a case, if a process gas such as argon gas at the same flow rate level as in the deposition process is continuously allowed to flow (in this case, at an argon flow rate of, e.g., about 15 sccm) in the same manner as described above, such a problem can be avoided, though continued supply of the process gas is not mandatory. When the preliminary standby step in the single-target deposition process area 62c is completed, in the same manner as described above, the wafer 1 is moved by the internal transportation robot 58 onto the wafer stage 63d used in the load lock chamber 61, while being mounted in the wafer susceptor 65, simultaneously with the movement of the other wafers being processed.

Next, as shown in FIG. 8, when the wafer stage 63d moves up to bring the load lock chamber 61 into a state spatially independent of the outside, air is supplied from the gas supply line 76 to achieve the same air pressure as that of external air. At this time, the wafer gate 77 opens, and the external robot 56 shown in FIG. 1 removes the wafer susceptor 65 having the wafer 1 mounted therein onto the load port unit (step 108 of removing the wafer from the load rock chamber of FIG. 13). At this time, the lift stage 50 moves up to lift the wafer 1, and the lifted wafer 1 is moved to the wafer transportation vessel 54 by the external robot 56 (step 109 of retrieving the wafer from the susceptor of FIG. 13). In this manner, a multilayer plating unit cycle 100 (FIG. 13) is completed to loop back to a stage before the step 101 of mounting the wafer in the susceptor is initiated.

In typical mass production steps, such a cycle is repeated in succession, and processing of a large number of wafers is continuously performed so as to minimize a time period during which each of the stages 63a, 63b, 63c, and 63d is unoccupied.

5. Detailed Description of Apparatus Structure Used in Wafer-Back-Side Multilayer Metal Layer Deposition Process, etc. in Method of Manufacturing Semiconductor Device in Above Embodiment of Present Invention (See Mainly FIGS. 25 to 34)

In this section, a description will be given to a deposition apparatus and the like described in the third section for avoiding various troubles due to the bend of the wafer 1 in performing the process of the fourth section, particularly to the devised cross-sectional shape of the wafer susceptor 65 (susceptor) of FIGS. 4 and 5.

Note that, in the following, a description will be given mainly to a 200-Φ wafer. However, since the amount of the bend should be controlled independently of the diameter of the wafer, it can be considered that the following statement holds true irrespective of the diameter of the wafer.

In this section, a knife-edge wafer (wafer not subjected to edge trimming) is mainly used, but it will be appreciated that even an edge-trimmed wafer may also be used.

Figure 25:
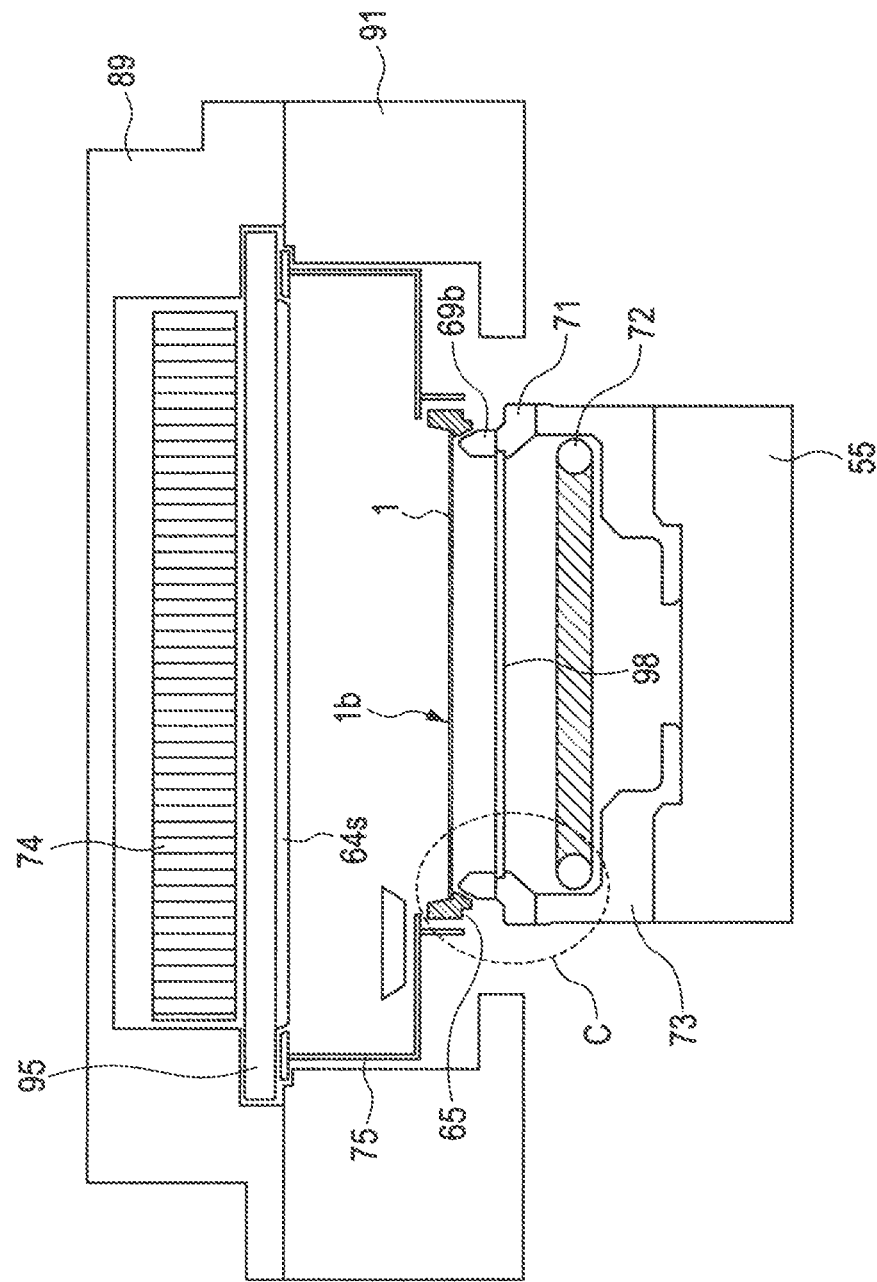
FIG. 25 is a cross-sectional view of the device for illustrating greater details of a lamp-heating wafer stage 63a and the periphery thereof in FIG. 7.
Figure 26:
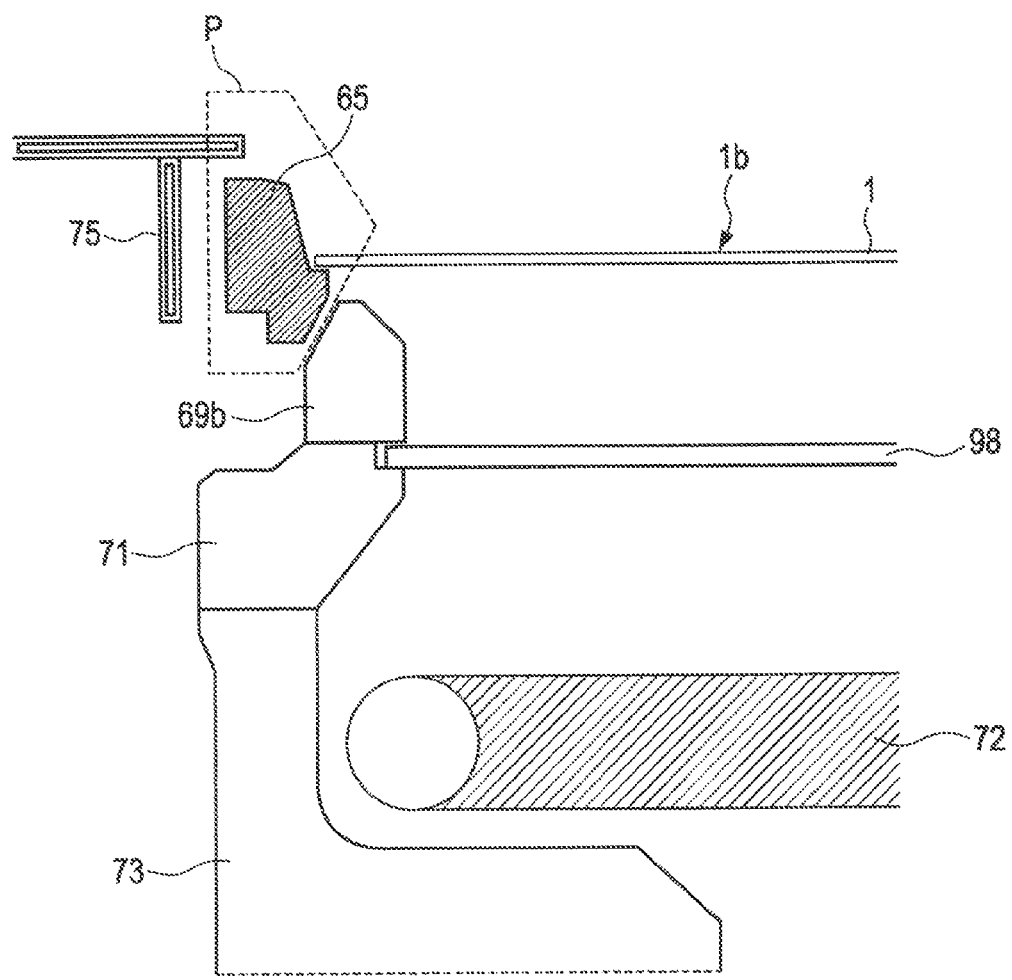
FIG. 26 is an enlarged cross-sectional view of a cut-out portion C of an end portion of the heating stage of FIG. 25.
Figure 27:
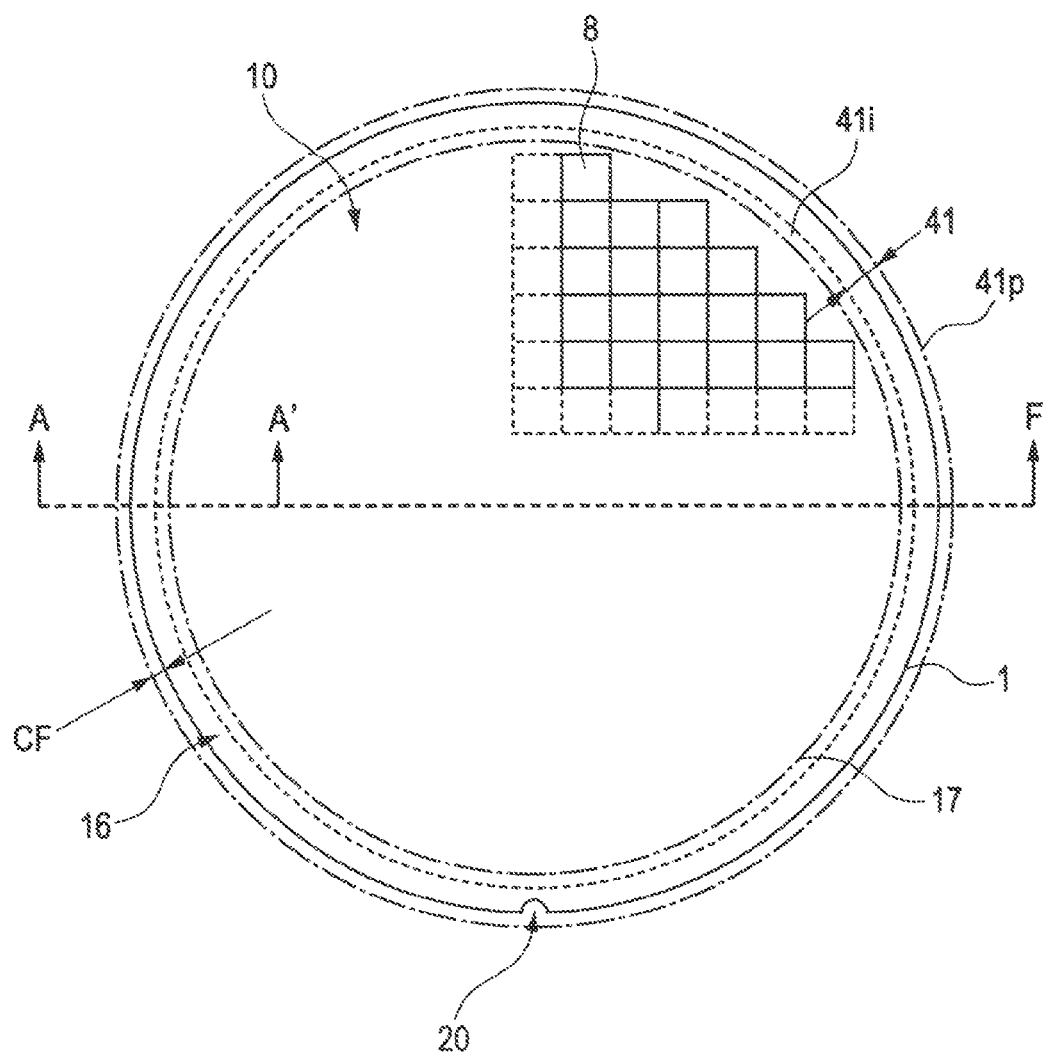
Figure 28:
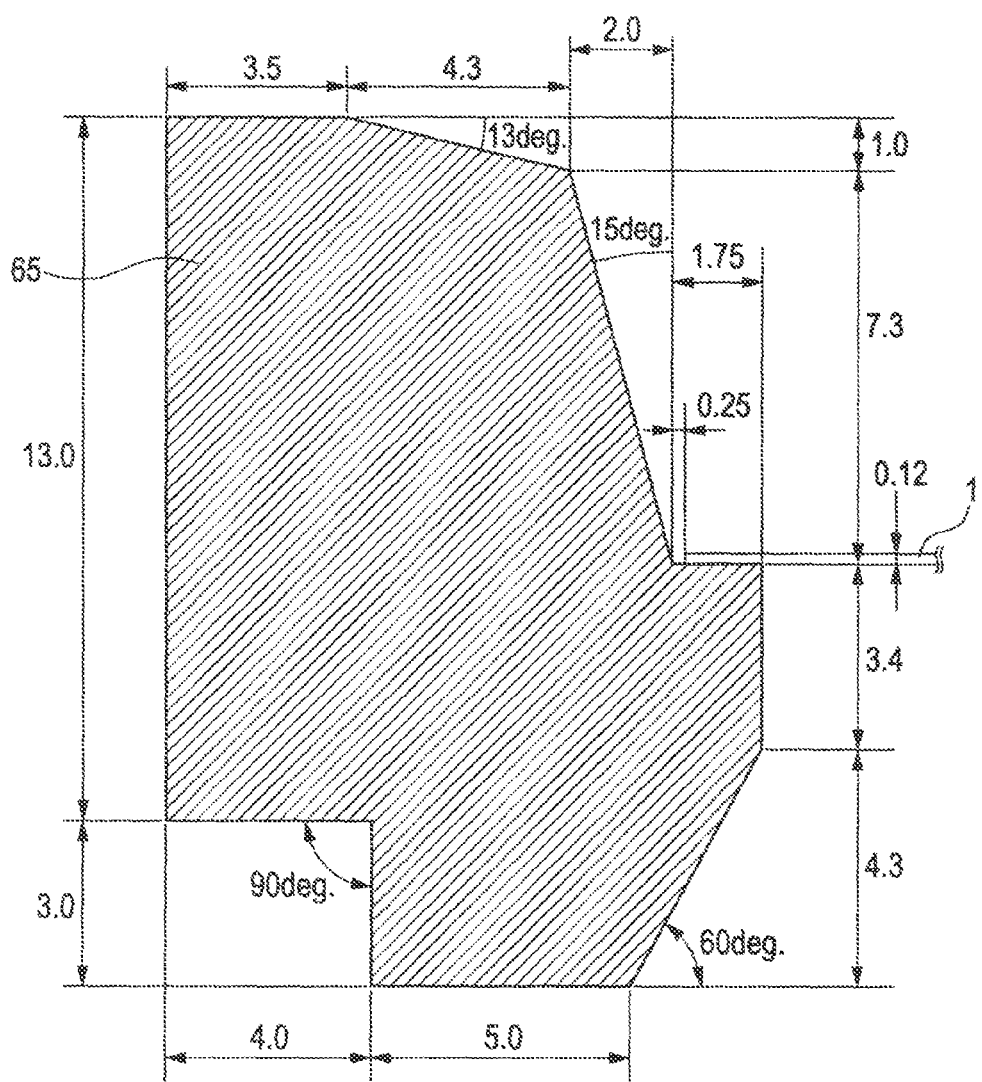
FIG. 28 is a partial cross-sectional view (partly showing a state where a flat wafer having a trimmed edge is held by its own weight) of a ring-shaped wafer susceptor used in a film deposition/heating process in the method of manufacturing the semiconductor device of the embodiment of the present invention, which shows an example of the main angles and main dimensions of a radial vertical cross section (corresponding to a cut-out portion P around the susceptor of FIG. 26 and to the A-A' cross section, i.e., radial vertical cross section of FIG. 27) of the susceptor.
Figure 29:
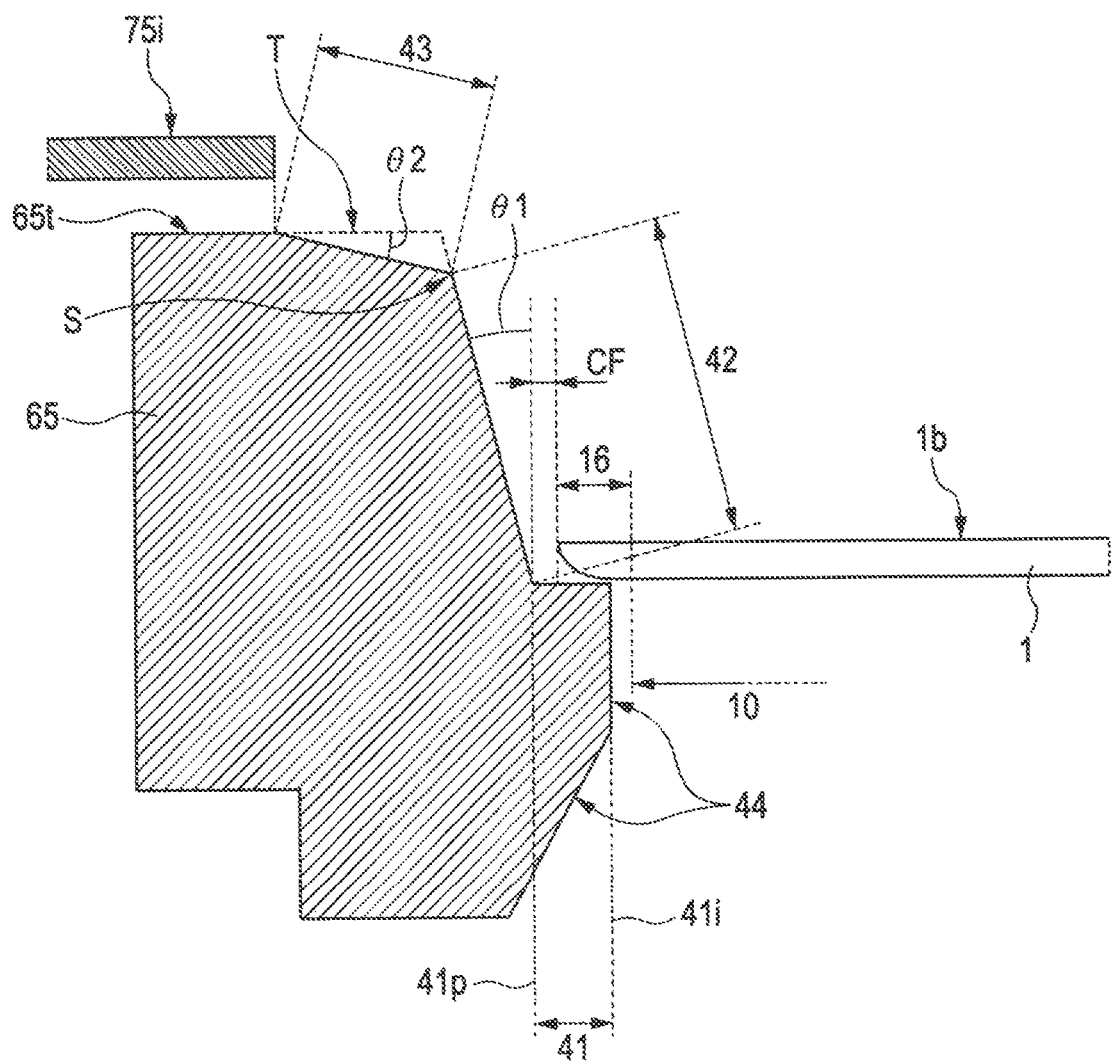
FIG. 29 is a partial cross-sectional view (partly showing a state where a flat wafer having an untrimmed edge is held by its own weight) of the ring-shaped wafer susceptor used in the film deposition/heating process in the method of manufacturing the semiconductor device of the embodiment of the present invention, which shows an example of a cross-sectional structure of the radial vertical cross section (corresponding to the cut-out portion P around the susceptor of FIG. 26 and to the A-A' cross section, i.e., radial vertical cross section of FIG. 27) of the susceptor.
Figure 30:
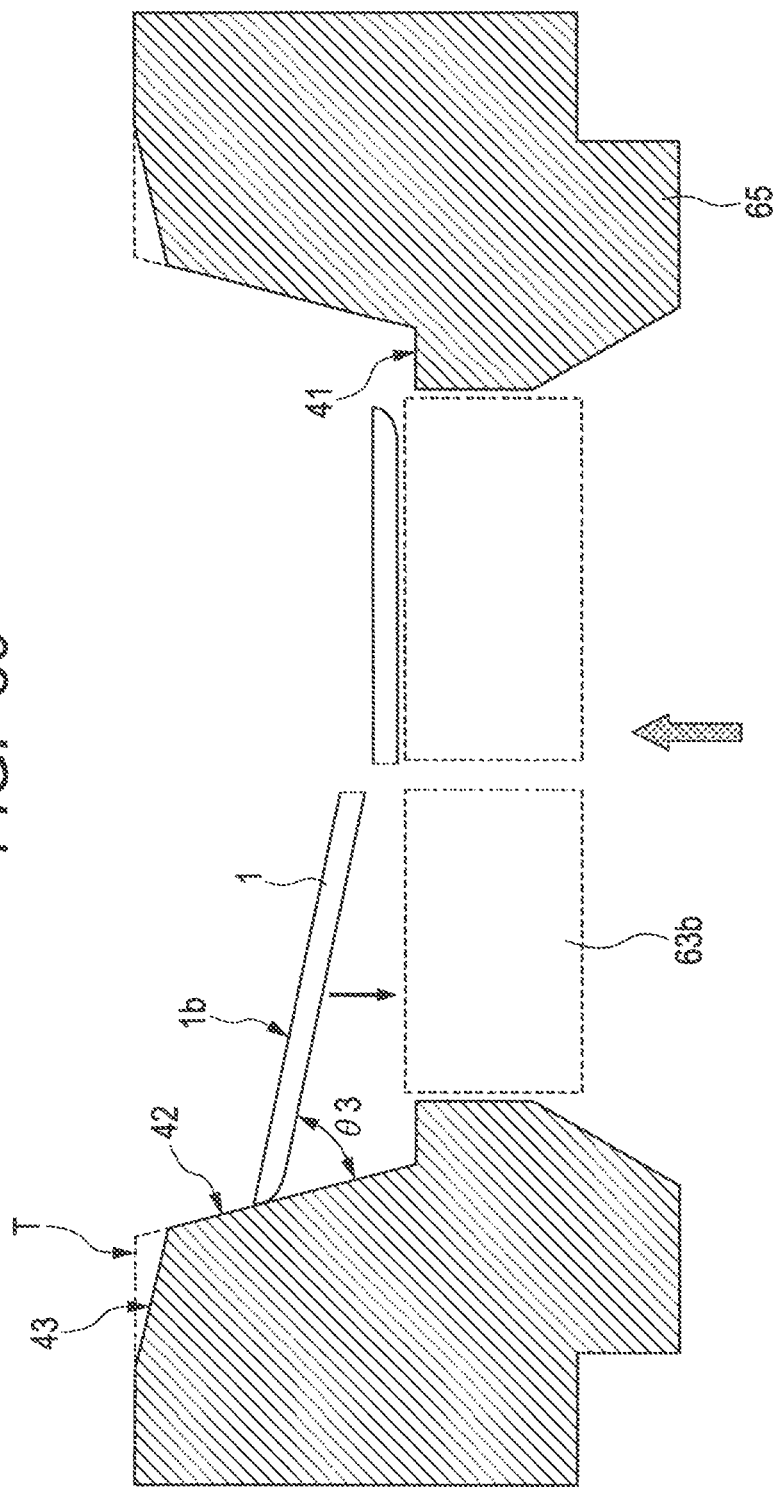
FIG. 30 is an overall cross-sectional view of the susceptor and the like over the cooling wafer stage 63c corresponding to the A-F cross section of FIG. 27, which is for illustrating a problem caused by the displacement of a wafer.
Figure 31:
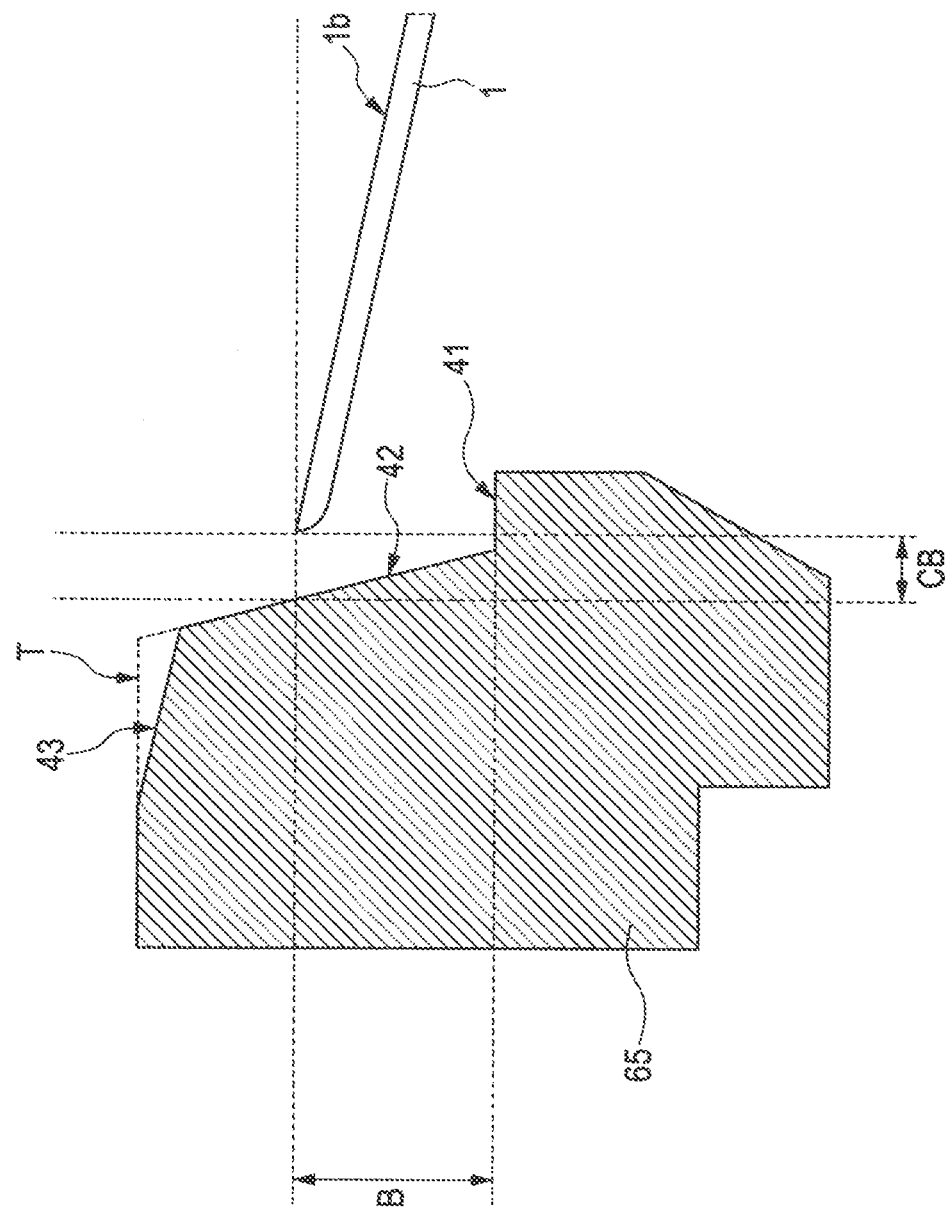
FIG. 31 is a partial cross-sectional view (partly showing a state where a bent wafer having an untrimmed edge is held by its own weight) of the ring-shaped wafer susceptor used in the film deposition/heating process in the method of manufacturing the semiconductor device of the embodiment of the present invention, which shows an example of a cross-sectional structure of the radial vertical cross section (corresponding to the cut-out portion P around the susceptor of FIG. 26 and to the A-A' cross section, i.e., radial vertical cross section of FIG. 27) of the susceptor.
Figure 32:
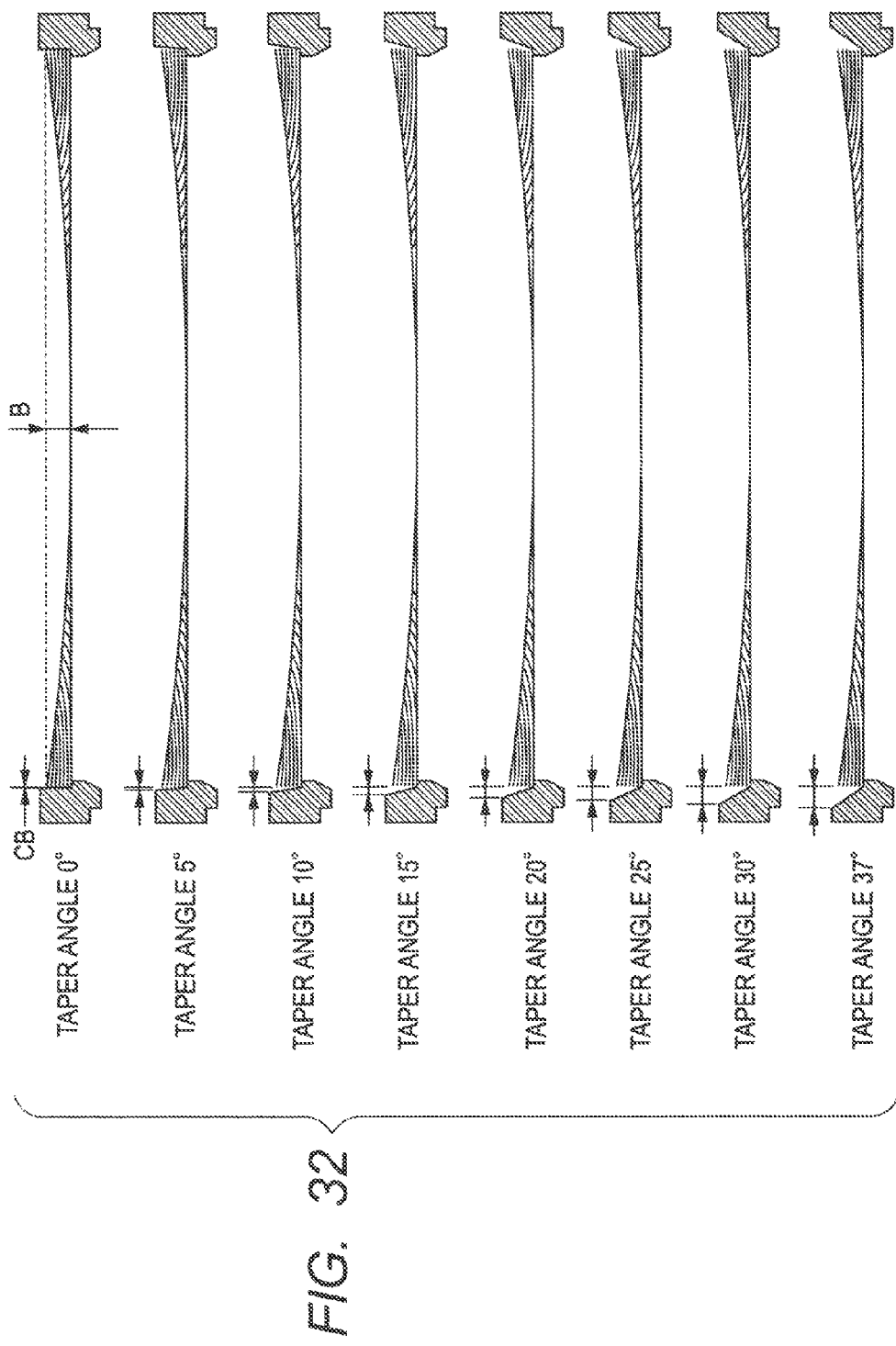
FIG. 32 is an illustrative view illustrating, using a 200-Φ wafer having an amount of bend of 6 millimeters as an example, the relationship between an angle Θ1 (taper angle) formed by a side inner surface (second upper surface) and a vertical surface and a clearance CB between an end portion of the bent wafer and the inner surface of the susceptor.
Figure 33:
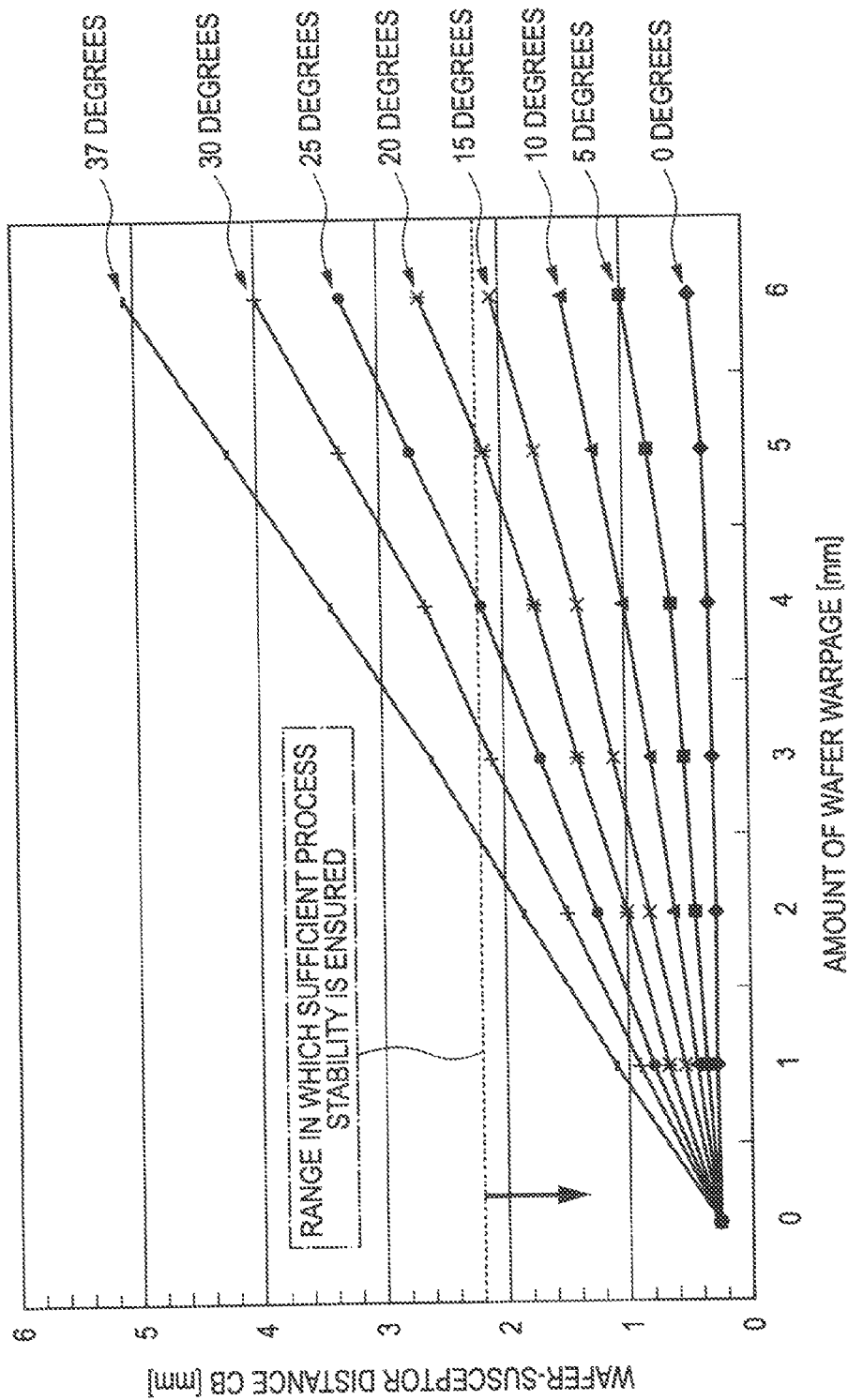
FIG. 33 is an illustrative view of an organized interrelation between each of the amounts of bend and the clearance CB between the end portion of the bent wafer and the inner surface of the susceptor relative to the angle Θ1 (taper angle) formed by the side inner surface (second upper surface) and the vertical surface.
Figure 34:
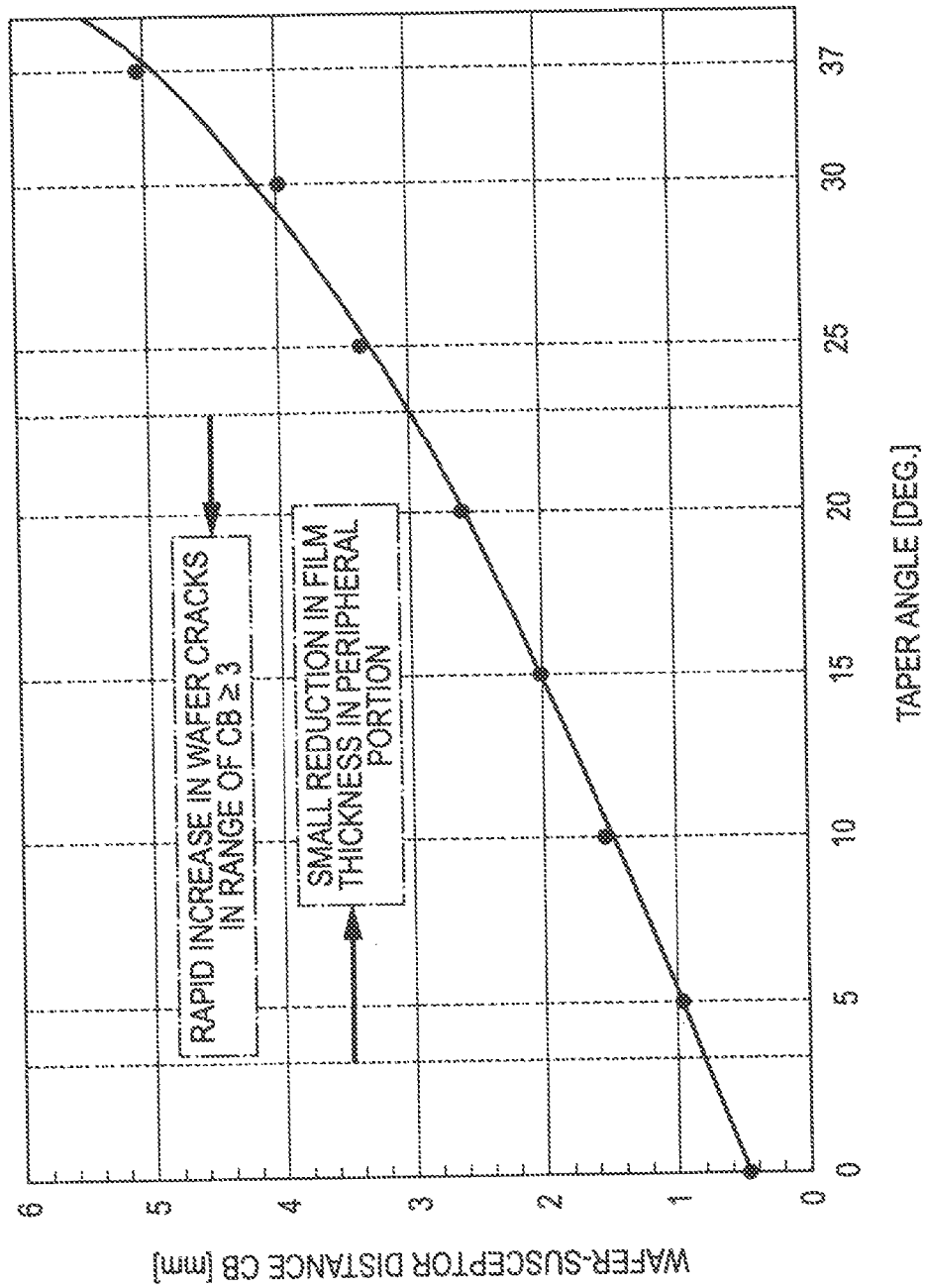
FIG. 34 is a data plot graph (corresponding to FIG. 32) obtained by plotting, using the 200-Φ wafer having the amount of bend of 6 millimeters as an example, the relationship between the angle Θ1 (taper angle) formed by the side inner surface (second upper surface) and the vertical surface and the clearance CB between the end portion of the bent wafer and the inner surface of the susceptor.

FIG. 25 is a cross-sectional view of the device for illustrating greater details of the lamp-heating wafer stage 63a and the periphery thereof in FIG. 7. FIG. 26 is an enlarged cross-sectional view of a cut-out portion C of an end portion of the heating stage of FIG. 25. FIG. 27 is a plan view of the wafer and the wafer susceptor on the periphery thereof for illustrating the relationships between the wafer and the individual parts of the wafer susceptor over the lamp-heating wafer stage 63a. FIG. 28 is a partial cross-sectional view (partly showing a state where a flat wafer having a trimmed edge is held by its own weight) of the ring-shaped wafer susceptor used in a film deposition/heating process in the method of manufacturing the semiconductor device of the embodiment of the present invention, which shows an example of the main angles and main dimensions of a radial vertical cross section (corresponding to a cut-out portion P around the susceptor of FIG. 26 and to the A-A' cross section, i.e., radial vertical cross section of FIG. 27) of the susceptor. FIG. 29 is a partial cross-sectional view (partly showing a state where a flat wafer having an untrimmed edge is held by its own weight) of the ring-shaped wafer susceptor used in the film deposition/heating process in the method of manufacturing the semiconductor device of the embodiment of the present invention, which shows an example of a cross-sectional structure of the radial vertical cross section (corresponding to the cut-out portion P around the susceptor of FIG. 26 and to the A-A' cross section, i.e., radial vertical cross section of FIG. 27) of the susceptor. FIG. 30 is an overall cross-sectional view of the susceptor and the like over the cooling wafer stage 63c corresponding to the A-F cross section of FIG. 27, which is for illustrating a problem caused by the displacement of a wafer. FIG. 31 is a partial cross-sectional view (partly showing a state where a bent wafer having an untrimmed edge is held by its own weight) of the ring-shaped wafer susceptor used in the film deposition/heating process in the method of manufacturing the semiconductor device of the embodiment of the present invention, which shows an example of a cross-sectional structure of the radial vertical cross section (corresponding to the cut-out portion P around the susceptor of FIG. 26 and to the A-A' cross section, i.e., radial vertical cross section of FIG. 27) of the susceptor. FIG. 32 is an illustrative view illustrating, using a 200-Φ wafer having an amount of bend of 6 millimeters as an example, the relationship between an angle Θ1 (taper angle) formed by a side inner surface (second upper surface) and a vertical surface and a clearance CB between an end portion of the bent wafer and the inner surface of the susceptor. FIG. 33 is an illustrative view of an organized interrelation between each of the amounts of bend and the clearance CB between the end portion of the bent wafer and the inner surface of the susceptor relative to the angle Θ1 (taper angle) formed by the side inner surface (second upper surface) and the vertical surface. FIG. 34 is a data plot graph (corresponding to FIG. 32) obtained by plotting, using the 200-Φ wafer having the amount of bend of 6 millimeters as an example, the relationship between the angle Θ1 (taper angle) formed by the side inner surface (second upper surface) and the vertical surface and the clearance CB between the end portion of the bent wafer and the inner surface of the susceptor. Note that a length is shown in units of millimeters, and an angle is shown in units of degrees. Based on the above drawings, a description will be given to the details of an apparatus structure used for the wafer-back-side multilayer metal layer deposition process or the like in the method of manufacturing the semiconductor device of the above embodiment of the present invention.

A more detailed structure of the lamp-heating wafer stage 63a and the periphery thereof is shown in FIG. 25. As shown in FIG. 25, the reflection plate 73 is provided over the stage support stand 55. Around the reflection plate 73, the wafer holder base 71 made of a metal is provided. Over the opening of the wafer holder base 71, the quartz window 98 is provided. Between the quartz window 98 and the reflection plate 73, the lamp heater 72 is provided. Over the wafer holder base 71, the wafer susceptor 65 is placed via the susceptor-positioning insulating ring 69b. In the wafer susceptor 65, the wafer 1 is held with the back surface 1b thereof facing upward. That is, the wafer 1 is in the freely placed state in the susceptor 65.

The wafer 1 is laterally surrounded by the inner wall 91 of the deposition process chamber at a given distance therefrom. The wafer 1 is covered with the outer wall 89 of the deposition process chamber located thereover at a given distance therefrom. Inside the outer wall 89 of the deposition process chamber, the nickel target 64s for forming a silicide film is fitted via the backing metal plate 95. Between the backing metal plate 95 and the outer wall 89 of the deposition process chamber, the magnetron magnet set 72 is fitted. The film deposition prevention shield 75 attached to the periphery of the nickel target 64s for forming a silicide film extends to the vicinity of the outer periphery of the entire ring-shaped susceptor 65. The cut-out portion C of the end portion of the heating stage of FIG. 25 is shown in greater detail in FIG. 26. As shown in FIG. 26, the ring-shaped susceptor 65 is fixed by its own weight or the like through the engagement of the inner side of the lower half thereof with the outer surface of the upper half of the annular susceptor-positioning insulating ring 69b.

Next, a two-dimensional relationship between the wafer 1 in the freely placed state in the susceptor 65 and the susceptor 65 is shown in FIG. 27 (obtained by viewing the wafer 1 placed in the susceptor 65 with the back surface thereof facing upward from therebelow, i.e., from the surface 1a side). As shown in FIG. 27, the wafer 1 is typically provided with a notch 20 for recognition of the orientation thereof. A region at, e.g., about 2 millimeters from the periphery of the surface 1a of the wafer 1 (e.g., 200-Φ wafer) is called a peripheral device non-formation region 16, and chip regions 8 are not formed in this region. On the other hand, in the inner region of the wafer 1, i.e., in the device formation region 10, the chip regions 8 are closely arranged in a matrix configuration with no space therebetween, but to the extent that the chip regions 8 do not protrude from the device formation region 10. In the drawing, for clear illustration, the chip regions 8 are depicted only in a part thereof. A boundary 17 between the device formation region 10 and the peripheral device non-formation region 16 is shown by the dash-dot lines. Here, the outermost dash-dot line indicates an outermost periphery 41p of a wafer holding portion 41 (first upper surface or wafer placement portion) of the susceptor 65. In a normal case, a wafer holding portion innermost periphery 41i is located outside the boundary 17 between the device formation region 10 and the peripheral device non-formation region 16. Also, when the wafer 1 is placed with the center thereof adjusted to match the center of the ring-shaped susceptor 65, between the outer periphery of the wafer 1 and the outermost periphery 41p of the wafer holding portion 41 of the susceptor 65, an allowance CF (clearance between the flat wafer end portion and the inner surface of the susceptor) of, e.g., about 0.25 millimeters (see FIG. 28) is normally provided.

Next, a cross section of each of the ring-shaped susceptors 65 used in the multilayer metal deposition process in the method of manufacturing the semiconductor device of the above embodiment of the present invention which corresponds to the X-O cross section of FIG. 4, i.e., a radial vertical cross section (substantially corresponding to a cut-out portion P around the susceptor of FIG. 26) of the annular shape is shown in FIG. 28, and an example of the dimensions thereof, the angles of the main portion thereof, and the like is shown. Here, the thickness of the wafer is set to, e.g., about 120 micrometers (about 0.12 millimeters). In the other drawings, wafers not subjected to edge trimming are mainly shown but, in FIG. 28, an edge-trimmed wafer is shown for reference.

Next, an enlarged cross-sectional view of the cut-out portion P around the susceptor of FIG. 26 substantially corresponding to FIG. 28 is shown in FIG. 29 (in which the wafer not subjected to edge trimming is shown). Note that the radial vertical cross section of the annular shape of the ring-shaped susceptor 65 is basically the same even if it is taken at this rotation angle except in parts (the displacement prevention notches 65n of FIG. 4) of the outer periphery. As shown in FIG. 29, the portion of the ring-shaped susceptor 65 which inevitably comes in contact with the wafer 1 is the wafer holding portion or wafer placement portion 41 (first upper surface), and normally forms a nearly horizontal surface.

An upper surface continued to and located outside the wafer placement portion 41 (first upper surface) is a side inner surface 42 (second upper surface), and has an inclination closer to that of a vertical surface than that of the wafer placement portion 41. The angle formed by the side inner surface 42 (second upper surface) and a vertical surface is referred to as a taper angle $\Theta 1$ (or first angle).

The side inner surface 42 (second upper surface) may also be continued to an upper end portion 65t (upper end horizontal surface) of the susceptor 65. In that case, a profile T obtained in the case where there is no upper inner surface is provided.

Alternatively, it may also be possible to interpose an additional surface closer to a horizontal surface than the side inner surface 42 (second upper surface), such as an upper inner surface 43 (third upper surface). If such an additional surface is interposed, it is possible to prevent a reduction in film thickness during sputtering deposition in the peripheral portion of the wafer 1. In this case, it may also be possible to further provide a round portion (chamfered portion) as shown by a profile S obtained when the side inner surface 42 (second upper surface) and the upper inner surface (third upper surface) are chamfered between the side inner surface and the upper inner surface. Such an angle formed by the upper inner surface 43 (third upper surface) and a horizontal surface is referred to as an upper cut angle $\Theta 2$. The upper cut angle $\Theta 2$ can be set to, e.g., about 13 degrees (ranging from about 8 degrees to 40 degrees). However, to achieve the effect described above, it is effective to locate the boundary between the upper end portion 65t (upper end horizontal surface) and the upper inner surface 43 (third upper surface) in the vicinity of an inner end 75i of the film deposition prevention shield 75. On the other hand, if a maximum amount of bend is assumed to be 6 millimeters, due to the need to maintain the height of the boundary between the side inner surface 42 (second upper surface) and the upper inner surface 43 (third upper surface) based on the wafer placement portion 41 (first upper surface) at a value of not less than the maximum amount of bend, the difference between the height of the boundary between the side inner surface 42 (second upper surface) and the upper inner surface 43 (third upper surface) and the height of the upper end portion 65t (upper end horizontal surface) is preferably set to about 1 millimeter (the upper limit value thereof is about 2 millimeters).

Note that, for a lower inner side surface 44 of the lower portion of the wafer placement portion 41 (first upper surface) to secure the strength of (securely reinforce) the wafer placement portion 41, it is effective to thicken the lower portion of the wafer placement portion 41 (first upper surface) to the extent that the distribution of heating light from below (intensity distribution of the heating light) is not disturbed. Here, for example, the upper half of the lower inner side surface 44 is formed substantially vertical, while the lower half thereof is tapered to be retracted. However, this portion can be variously modified in consideration of the secure reinforcement and the intensity distribution of the heating light.

Next, a cross-sectional view corresponding to the A-F cross section of FIG. 27 is shown in FIG. 30, and a description will be given to an in-susceptor positional shift of the bent wafer 1. This assumes, e.g., the following situation. That is, it can be considered that the in-susceptor positional shift resulting from the bent wafer in the multilayer metal film formation process shown in FIG. 24 occurs substantially in the step 111 of depositing the first metal film (the step of depositing the nickel film for silicide formation or a preheating step therefor). The wafer that has undergone the in-susceptor positional shift is sequentially subjected to one step after another, while being contained in the susceptor. When the wafer thus sequentially subjected to one step after another reaches, e.g., the step 106 (FIG. 13) of depositing the second metal film, it is chucked by the electrostatic chuck, i.e., brought into the restrained state. At this time, if the wafer has undergone the in-susceptor positional shift, the possibility of the occurrence of a problem increases, which will be described below.

First, the situation of the in-susceptor positional shift of the wafer that has occurred in the step of depositing the nickel film for silicide formation or preheating step therefor is illustrated in FIG. 30. As shown in FIG. 30, in the step 111 of depositing the first metal film (on the lamp-heating wafer stage 63a), if the amount of bend of the wafer 1 is large and the taper angle $\Theta 1$ is relatively large, a contact angle $\Theta 3$ between the side inner surface 42 (second upper surface) and the wafer 1 decreases so that slippery is more likely to occur. At this time, when mechanical vibration or the like is added, the wafer 1 is easily displaced to rise up over the side inner surface 42 (second upper surface).

When the wafer 1 in such a rise-up state is subjected to the step 106 of depositing the second metal film on the cooling wafer stage 63b, the wafer 1 is attracted by suction by the electrostatic chuck to be restrained, while being lifted by the cooling wafer stage 63b to a position slightly higher than the wafer placement portion 41 (first upper surface) (at this time, the wafer 1 is still contained in the susceptor). However, since one end portion of the wafer 1 remains over the side inner surface 42 (second upper surface) of the susceptor 65, the wafer 1 is eventually mechanically destroyed when attracted by suction.

FIGS. 31 and 32 show the cross section of the wafer 1 that has been bent but not shifted in the susceptor, which is taken along the line A-A' of FIG. 27. Next, using FIGS. 31 and 32, a description will be given to relations among the amount of bend of the wafer, a clearance CB between the end portion of the bent wafer and the inner surface of the susceptor, the taper angle $\Theta 1$ (first angle), the in-susceptor positional shift, and the like. As shown in FIG. 31, the clearance CB between the end portion of the bent wafer and the inner surface of the susceptor has a value obtained by adding the distance of retraction of the side inner surface 42 (second upper surface) which increases correspondingly to an amount B of wafer warpage and the distance of retraction of the wafer due to the bend to the clearance CF between the end portion of the flat wafer and the inner surface of the susceptor.

FIG. 32 graphically shows the clearances CB corresponding to the respective values of the taper angles Θ1 (first angles), which are 0, 5, 10, 15, 20, 25, 30, and 37 degrees (related art standard specifications), relative to the amount B of bend of the wafer which increases in 1-millimeter increments from 0 millimeters corresponding to the flat wafer to 6 millimeters. The following is the clearances CB(Θ1) corresponding to the respective taper angles Θ1, which are shown in millimeters. That is, CB(0)=0.42, CB(5)=0.98, CB(10)=1.5, CB(15)=2.06, CB(20)=2.65, CB(25)=3.29, CB(30)=3.98, and CB(37)=5.06 are satisfied.

It can be considered that the clearance CB is substantially equal to the initial amplitude of the wafer 1 when the mechanical vibration acts on the wafer. When the initial amplitude is large, the wafer is conceivably easily brought into a state as shown in FIG. 30. As shown in FIG. 29, "the length of an overlap" between the peripheral portion of the flat wafer 1 (in the case where there is no shift) and the wafer placement portion 41 (first upper surface) is about 1.5 millimeters, as can be seen from FIG. 28. However, when the initial amplitude surpasses the length of the overlap, the in-susceptor positional shift may occur. It can be considered that, when the initial amplitude surpasses double the length of the overlap (about 3 millimeters), the occurrence of the in-susceptor positional shift rapidly increases.

Accordingly, as shown in FIG. 34, the taper angle Θ1 (first angle) is preferably set to a value of not less than 0 degrees and not more than about 20 degrees. The lower limit may be about 0 degrees but, when the taper angle Θ1 is about 0 degrees, the thickness of the deposited film on the periphery of the wafer may undesirably decrease. Therefore, if the device formation region 10 (FIG. 27) is desired to expand to the vicinity of the periphery of the wafer, it is particularly preferable to set the lower limit to about 5 degrees. Also, as shown in FIG. 33, the upper limit may also be about 20 degrees but, when the stability of a mass production process is considered to be particularly important, it is particularly preferable to set the upper limit to about 15 degrees.

6. Consideration to Every Aspect of Present Invention and Supplemental Description to Each Embodiment Thereof.

Because of easy handling, processing of a thin-film wafer may occasionally be performed in a state where a reinforcing plate such as a glass plate or a silicon wafer is bonded to the surface of the wafer opposite to the surface thereof to be processed. However, a method using such a reinforcing plate is known as a relatively costly process. Accordingly, the above embodiment has not used such a reinforcing plate, and examined a method in which, even when the amount of bend is relatively large, the thin-film wafer is held in the freely placed state in the ring-shaped susceptor, and can be subjected to heating and a film deposition process.

This has made clear that, as shown in each of the descriptions, by optimizing (steepening) the inclination of the side wall which mainly restricts the lateral movement of the wafer in the susceptor, the occurrence of the in-susceptor positional shift can be effectively prevented.

To a transportation failure or wafer breakage resulting from the in-susceptor positional shift, the specific description has been given above using, as an example, the transportation failure or wafer breakage which occurs in the process of the attraction/restraint by suction or the like mainly performed after the heating deposition process in the state in which the wafer is contained in the susceptor. However, when the main portion of the wafer is contained in the susceptor, but a part thereof protrudes to the outside, the transportation failure or wafer breakage may cause a problem such as the destruction of another structure through contact with the wafer during the transportation thereof. Also, in an untrimmed wafer, even a slight displacement may cause a crack through the contact of the wafer with the susceptor, another structure, or a handling apparatus.

7. Summary

While the invention achieved by the present inventors has been specifically described heretofore based on the embodiments thereof, the present invention is not limited thereto. It will be appreciated that various changes and modifications can be made in the invention within the scope not departing from the gist thereof.

For example, in the above embodiment, the specific description has been given using the power MOSFET as an example, but the present invention is not limited thereto. It will be appreciated that the present invention is widely applicable to another stand-alone device such as IGBT or LDMOSFET, and to an integrated circuit element including such a stand-alone device or the others.

Also, in the above embodiment, the specific description has been given to the N-channel device such as an N-channel power MOSFET, but the present invention is not limited thereto. It will be appreciated that the present invention is also applicable to a P-channel device such as a P-channel power MOSFET. In that case, it is appropriate to perform a PN inverting operation of thoroughly replacing the P-type and N-type conductivities with each other in the above embodiment.

Also, in the above embodiment, the specific description has been given to the example in which the present invention is applied to the formation of the multilayer metal film at the back surface of a substrate such as a wafer, but the present invention is not limited thereto. It will be appreciated that the present invention is also applicable to the formation of a multilayer film including an insulating film and a metal film at the back surface of a substrate such as a wafer and to the formation of a multilayer metal film or a multilayer film including an insulating film and a metal film at a device surface (first main surface) of a substrate such as a wafer. Also, in the above embodiment, the specific description has been given mainly to a power-type MOSFET or an IGBT having a silicon-based substrate, but the present invention is not limited thereto. It will be appreciated that the present invention is also applicable to a power-type MOSFET or an IGBT using a SiC-based substrate, a GaN substrate, a GaAs substrate, an InP substrate, or the like.

What is claimed is:

1. A method of manufacturing a semiconductor device, comprising the steps of:
   (a) performing a grinding process on a back surface of a semiconductor wafer having a top surface thereof for which a device element formation process has been completed to thin the semiconductor wafer;
   (b) after the step (a), performing a preheating process on the semiconductor wafer in a state where the semiconductor wafer is held on a susceptor by its own weight with the top surface thereof facing downward to heat the semiconductor wafer to a temperature higher than a room temperature; and
   (c) after the step (b), depositing a first metal film by sputtering deposition over the back surface of the semiconductor wafer in a state where the semiconductor wafer is held on the susceptor by its own weight with the top surface thereof facing downward, while maintaining the heated state, wherein the susceptor exhibits an annular shape, and a radial vertical cross section of the annular shape has the following upper surfaces, which are:

(x1) the first upper surface for holding a peripheral portion of the top surface of the semiconductor wafer against gravity; and (x2) the second upper surface continued to and located outside the first upper surface, and having an inclination closer to that of a vertical surface than an inclination of the first upper surface to hold a side surface of the semiconductor wafer against lateral displacement, and wherein a first angle formed by the second upper surface and the vertical surface is not less than 0 degrees and not more than 20 degrees.

2. A method of manufacturing a semiconductor device according to claim 1, wherein the first angle is not less than 5 degrees and not more than 15 degrees.

3. A method of manufacturing a semiconductor device according to claim 2, wherein the susceptor is made of quartz.

4. A method of manufacturing a semiconductor device according to claim 3, wherein the semiconductor device is a power-type semiconductor device.

5. A method of manufacturing a semiconductor device according to claim 4, wherein the semiconductor wafer is a silicon-based wafer.

6. A method of manufacturing a semiconductor device according to claim 5, further comprising the step of:

(d) after the step (c), performing a heating process in a state where the semiconductor wafer is held on the susceptor by its own weight with the top surface thereof facing downward to silicidize the first metal film.

7. A method of manufacturing a semiconductor device according to claim 6, further comprising the steps of:

(e) after the step (d), causing a suction attracting stage to attract the top surface of the semiconductor wafer by suction in a state where the semiconductor wafer is contained in the susceptor; and (f) after the step (e), depositing a second metal film by sputtering deposition over the back surface of the semiconductor wafer in a state where the semiconductor wafer is contained in the susceptor with the top surface of the semiconductor wafer being attracted by suction by the suction attracting stage.

8. A method of manufacturing a semiconductor device according to claim 7, wherein a thickness of the semiconductor wafer after the step (a) is not more than 280 micrometers.

9. A method of manufacturing a semiconductor device according to claim 8, wherein, in the steps (b) to (f), the semiconductor wafer is not bonded to a reinforcing plate.

10. A method of manufacturing a semiconductor device according to claim 9, wherein the radial vertical cross section of the annular shape of the susceptor has the following upper surface, which is:

(x3) the third upper surface continued to and located outside the second upper surface, and having an inclination closer to that of a horizontal surface than the inclination of the second upper surface.

11. A method of manufacturing a semiconductor device according to claim 1, wherein, in the steps (b) to (c), the semiconductor wafer is not bonded to a reinforcing plate.

12. A method of manufacturing a semiconductor device according to claim 1, wherein the temperature to which the semiconductor wafer is heated by the preheating process is not less than 250 degrees Celsius.

* * * * *